(12) United States Patent
Fenney

(10) Patent No.: US 12,088,856 B2
(45) Date of Patent: *Sep. 10, 2024

(54) COMPRESSING AND DECOMPRESSING IMAGE DATA USING COMPACTED REGION TRANSFORMS

(71) Applicant: Imagination Technologies Limited, Kings Langley (GB)

(72) Inventor: Simon Fenney, St. Albans (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/141,345

(22) Filed: Apr. 28, 2023

(65) Prior Publication Data

US 2023/0262269 A1   Aug. 17, 2023

Related U.S. Application Data

(63) Continuation of application No. 17/402,399, filed on Aug. 13, 2021, now Pat. No. 11,647,234, which is a (Continued)

(30) Foreign Application Priority Data

May 3, 2016 (GB) ..................................... 1607707

(51) Int. Cl.
*H04N 19/94* (2014.01)
*H03M 7/30* (2006.01)
(Continued)

(52) U.S. Cl.
CPC .............. *H04N 19/94* (2014.11); *H03M 7/30* (2013.01); *H03M 7/3068* (2013.01);
(Continued)

(58) Field of Classification Search
None
See application file for complete search history.

(56) References Cited

U.S. PATENT DOCUMENTS 6,026,217 A * 2/2000 Adiletta ............... H04N 19/159
709/247
2003/0223633 A1* 12/2003 Pohjola ................ H04N 19/186
375/E7.166

(Continued)

FOREIGN PATENT DOCUMENTS

EP    1367835 A2    12/2003

*Primary Examiner* — Delomia L Gilliard
(74) *Attorney, Agent, or Firm* — Potomac Law Group, PLLC; Vincent M DeLuca

(57) ABSTRACT

A method of compressing image data comprising a set of image values each representing a position in image-value space so as to define an occupied region thereof. The method comprises selectively applying a series of compression transforms to subsets of the image data items to generate a transformed set of image data items occupying a compacted region of value space. The method further comprises identifying a set of one or more reference data items that quantizes the compacted region in value space. For each image data item in the set of image data items, a sequence of decompression transforms from a fixed set of decompression transforms is identified that generates an approximation of that image data item when applied to a selected one of the one or more reference data items. Each image data item in the set of image data items is encoded as a representation of the identified sequence of decompression transforms for that image data item. The encoded image data items, set of reference data items and the fixed set of decompression transforms are stored as compressed image data.

9 Claims, 11 Drawing Sheets

Related U.S. Application Data continuation of application No. 16/452,094, filed on Jun. 25, 2019, now Pat. No. 11,122,301, which is a continuation of application No. 15/585,323, filed on May 3, 2017, now Pat. No. 10,375,418.

(51) Int. Cl.
| | |
|---|---|
| *H04N 19/124* | (2014.01) |
| *H04N 19/167* | (2014.01) |
| *H04N 19/186* | (2014.01) |
| *H04N 19/196* | (2014.01) |
| *H04N 19/426* | (2014.01) |
| *H04N 19/46* | (2014.01) |
| *H04N 19/60* | (2014.01) |

(52) U.S. Cl.
CPC ........ *H03M 7/3082* (2013.01); *H04N 19/124* (2014.11); *H04N 19/167* (2014.11); *H04N 19/186* (2014.11); *H04N 19/196* (2014.11); *H04N 19/426* (2014.11); *H04N 19/46* (2014.11); *H04N 19/60* (2014.11)

(56) References Cited

U.S. PATENT DOCUMENTS

| | | | |
|---|---|---|---|
| 2004/0133927 A1* | 7/2004 | Sternberg | G06F 16/7847 375/240 |
| 2004/0217956 A1 | 11/2004 | Besl et al. | |
| 2010/0124284 A1* | 5/2010 | Lee | H04N 19/129 375/240.18 |
| 2017/0130271 A1* | 5/2017 | Wong | G01N 33/5011 |

* cited by examiner

COMPRESSING AND DECOMPRESSING IMAGE DATA USING COMPACTED REGION TRANSFORMS

CROSS-REFERENCE TO RELATED APPLICATIONS AND CLAIM OF PRIORITY

This application is a continuation under 35 U.S.C. 120 of application Ser. No. 17/402,399 filed Aug. 13, 2021, now U.S. Pat. No. 11,647,234, which is a continuation of prior application Ser. No. 16/452,094 filed Jun. 25, 2019, now U.S. Pat. No. 11,122,301, which is a continuation of prior application Ser. No. 15/585,323 filed May 3, 2017, now U.S. Pat. No. 10,375,418, which claims foreign priority under 35 U.S.C. 119 from United Kingdom Application No. 1607707.5 filed May 3, 2016, the contents of which are incorporated herein by reference.

BACKGROUND

The present disclosure relates to compressing and decompressing image data. Some aspects relate in particular to the compression and decompression of colour data associated with blocks of one or more pixels and/or texels of the type that may be used as part of computer graphics systems.

There are many circumstances where it may be desirable to compress image data in order to reduce the amount of required storage, or memory, space. Computer graphics is one field where it may be desirable to reduce the amount of storage for image data. In computer graphics systems, each colour (e.g. the colour of a pixel, or block of one or more pixels) may comprise one or more components, e.g. red, green and blue (known collectively as RGB) and alpha (a), where alpha represents a transparency or blending component used when a colour is to be overlaid on an existing colour. Other colour components may also be specified such as YUV (where Y represents luma and U and V each represent chrominance components). Each stored colour may use a number of bits (e.g. 8 bits) for each colour component. The number of bits per colour component can be increased or decreased for greater or lesser colour resolution.

One approach to compress colour data for an image is to encode the data for that image in some way so that the encoding is stored rather than the complete set of colour values for the image. One way to encode the colour data is to use vector quantisation. Vector quantization is generally directed to the idea of representing an input value space (e.g. a colour space) as a discrete output space. In practice, the input space is likely to also be discretised, but at a finer resolution than the output space. The vectors that represent this discretised output space may be referred to as codevectors, or codewords. The set of codevectors may be stored in a codebook that may be index-referenced. Although vector quantization can be used to represent a colour space well, the codebook can in certain circumstances become very large, limiting the effectiveness of vector quantization as a way of compressing image data.

Another approach to encode colour data for an image is to apply a colour-space conversion. Here, a colour space spanned by the image data may be converted to a different colour space. One example of a colour space conversion is the conversion from RGB space to YUV space, for example YCbCr, where Y represents the luma, Cb represents the blue component minus the luma, and Cr represents the red component minus the luma. The converted space is typically assumed to be an N-dimensional rectangular prism (with the number of dimensions N being equal to the number of colour components). However a problem with this approach is that certain encodings may produce values that are outside of the range of the space once those encodings have been converted.

BRIEF SUMMARY

According to a first aspect of the present disclosure there is provided a method of compressing image data comprising a set of image data items each specifying a position in image-value space so as to define an occupied region thereof, the method comprising: selectively applying a series of compression transforms to subsets of the image data items to generate a transformed set of image data items occupying a compacted region of value space; identifying a set of one or more reference data items that quantizes the compacted region in value space; identifying for each image data item in the set of image data items a sequence of decompression transforms from a fixed set of decompression transforms that generates an approximation of that image data item when applied to a selected one of the one or more reference data items; encoding each image data item in the set of image data items as a representation of the identified sequence of decompression transforms for that image data item; and storing the encoded image data items, the set of one or more reference data items and the fixed set of decompression transforms as compressed image data.

Each decompression transform in the fixed set of decompression transforms may reverse the effect of a corresponding compression transform in the series of compression transforms.

The sequence of decompression transforms identified for each image data item may reverse the compression transforms applied to that image data item to compact the occupied region of value space.

The method may further comprise: identifying data items representable with the fixed set of decompression transforms and set of one or more reference data items; and identifying as the sequence of decompression transforms for each image data item the sequence of transforms used to generate the representable data item that most closely matches that image data item.

For each of the encoded image data items, an indication of one of the reference data items from the set of one or more reference data items which is to be used to decode the encoded image data item may be stored.

The fixed set of decompression transforms may be identified from the series of compression transforms.

The fixed set of decompression transforms may be an ordered set of transforms that when selectively applied to subsets of the transformed set of image data items reverses compaction of the occupied region of value space caused by applying the series of compression transforms.

The image-value space may be a colour space and each image data item may represent a position in the colour space. Each position in colour space may specify one or more colour values.

Each image data item in the set of image data items may be an n-tuple that represents one or more colour values.

The image data may be texture data and each image data item in the set of image data items may represent one or more colour values associated with a respective block of one or more texels.

The set of reference data items may comprise a plurality of reference data items each representing a position in the colour space.

The number of reference data items in the set of reference data items may be less than the number of image data items in the set of image data items.

The set of reference data items may be stored in a number of bits less than the number of bits required for storing the set of image data items. Each encoded image data item may be stored in a number of bits less than the number of bits required for storing the data item it encodes.

Each image data item in the set of image data items may correspond to a transformed image data item in the transformed set of image data items.

According to a second aspect of the present disclosure there is provided an image data compressor configured to compress image data comprising a set of image data items each representing a position in value space so as to define an occupied region thereof, the compressor comprising: a compression transform block configured to selectively apply a series of compression transforms to subsets of the image data items to generate a transformed set of image data items occupying a compacted region of value space; a quantization unit configured to identify a set of one or more reference data items that quantizes the compacted region in value space; an encoding block configured to, for each image data item in the set of image data items: identify a sequence of decompression transforms from a fixed set of decompression transforms that generates an approximation of that image data item when applied to a selected one of the set of one or more reference data items; and encode the image data item as a representation of the identified sequence of decompression transforms for that image data item; and a memory configured to store the encoded image data items, set of reference data items and the fixed set of decompression transforms as compressed image data.

Each decompression transform in the fixed set of decompression transforms may reverse the effect of a corresponding compression transform in the series of compression transforms.

The sequence of decompression transforms identified for each image data item may reverse the compression transforms applied to that image data item to compact the occupied region of value space.

The encoding block may be configured to: identify data items representable with the fixed set of decompression transforms and set of one or more reference data items; identify as the sequence of decompression transforms for each image data item the sequence of transforms used to generate the representable data item that most closely matches that image data item.

The memory may be further configured to store, for each of the encoded image data items, an indication of one of the reference data items from the set of one or more reference data items which is to be used to decode the encoded image data item.

The compressor may further comprise a reversal transform block configured to identify the fixed set of decompression transforms from the series of compression transforms.

The reversal transform block may be configured to identify as the fixed set of decompression transforms an ordered set of transforms that when selectively applied to the transformed set of image data items reverses compaction of the occupied region of value space caused by applying the series of compression transforms.

The value space may be a colour space and each image data item represents a position in the colour space.

Each position in colour space may specify one or more colour values.

Each image data item in the set of image data items may be an n-tuple that represents one or more colour values.

The image data may be texture data and each image data item in the set of image data items may represent one or more colour values associated with a respective block of one or more texels.

The set of reference data items may comprise a plurality of reference data items each representing a position in the colour space.

The number of reference data items in the set of reference data items may be less than the number of image data items in the set of image data items.

The set of reference data items may be stored in a number of bits less than the number of bits required for storing the set of image data items.

The encoding block may be configured to encode each image data item in a number of bits less than the number of bits required for storing that image data item when not encoded.

Each image data item in the set of image data items may correspond to an image data item in the transformed set of image data items.

According to a third aspect of the present disclosure there is provided a method of decompressing compressed image data comprising an item of encoded image data encoding a position in image-value space, and a set of one or more reference data items, the encoded image data item identifying a sequence of transforms from a predetermined set of transforms, the method comprising: using the encoded image data item to apply the sequence of transforms identified by that encoded data item to a reference data item selected from the set of one or more reference data items to thereby transform that reference data item to a decoded image data item.

The image data item may be an n-tuple. The image-value space may be a colour space.

The encoded image data item may encode an n-tuple specifying a position in the colour space.

The decoded image data item may specify a position in colour space corresponding to the position in colour space encoded by the encoded image data item used to generate that decoded image data item.

Each of the one or more reference data items may represents a position in the colour space.

The encoded image data item may be used to apply the sequence of transforms identified by that encoded image data item to the reference data item to thereby transform that reference data item from an initial position in colour space to a position corresponding to the position encoded by that encoded image data item.

Each position in colour space may specify one or more colour values.

The image data may be texture data and the image data item may represent one or more colour values associated with a block of one or more texels.

The encoded image data item may contain information to select the reference data item from the set of one or more reference data items.

The encoded image data item may contain information representing the selective application of each transform from the predetermined set of transforms to thereby identify the sequence of transforms to be applied to the reference data item.

The information may be in the form of a series of data units, each data unit representing the selective application of a corresponding transform from the predetermined set of transforms.

The encoded image data item may occupy a number of bits less than the number of bits occupied by its corresponding decoded image data item.

The predetermined set of transforms may be an ordered set.

The compressed image data may comprise a plurality of encoded image data items each identifying a sequence of transforms from the predetermined set of transforms, and the method may further comprise, for each encoded image data item: using the encoded image data item to apply the sequence of transforms identified by that encoded data item to a reference data item from the set of one or more reference data items to thereby transform that reference data item to a decoded image data item.

Each encoded image data item may be used to generate a corresponding decoded image data item.

The set of reference data items may represent a quantization of a region of colour space that is smaller in extent than the region of colour space spanned by the decoded image data items.

According to a fourth aspect of the present disclosure there is provided an image data decompressor configured to decompress compressed image data comprising an item of encoded image data encoding a position in image-value space, and a set of one or more reference data items, the encoded image data item identifying a sequence of transforms from a predetermined set of transforms, the decompressor comprising: a decompression transform block configured to use the encoded image data item to apply the sequence of transforms identified by that encoded image data item to a reference data item selected from the set of one or more reference data items to thereby transform the reference data item to a decoded image data item.

An image data decompressor as claimed in claim 2, wherein the image data item is an n-tuple.

The image-value space may be a colour space.

The encoded image data item may encode an n-tuple specifying a position in the colour space.

The decoded image data item may specify a position in colour space corresponding to the position in colour space encoded by the encoded image data item used by the decompression transform block to generate that decoded image data item.

Each of the one or more reference data items may represent a position in the colour space.

The decompression transform block may be configured to use the encoded image data item to apply the sequence of transforms identified by that encoded data item to said reference data item to thereby transform that reference data item to a position in colour space corresponding to the position in colour space encoded by that encoded image data item.

Each position in colour space may specify one or more colour values.

The image data may be texture data and the image data item represents one or more colour values associated with a block of one or more texels.

The decompression transform block may load the set of one or more reference data items and the set of predetermined transforms from a memory.

The decompression transform block may interpret information contained in the encoded image data item to select said reference data item from the set of one or more reference data items.

The decompression transform block may be configured to interpret information contained in that encoded data item representing the selective application of each transform from the predetermined set of transforms to thereby identify the sequence of transforms to be applied to the selected reference data item.

The information may be in the form of a series of data units, each data unit representing the selective application of a corresponding transform from the predetermined set of transforms.

The decompression transform block may be configured to output the decoded image data item in a format that occupies a greater number of bits than its corresponding encoded image data item.

The compressed image data may comprise a plurality of encoded image data items, and the decompression transform block may be further configured to, for each encoded image data item, use the encoded image data item to apply the sequence of transforms identified by that encoded image data item to one of the reference data items selected from the set of one or more reference data items to thereby transform the reference data item to a decoded image data item.

The decompression transform block may be configured to use each encoded image data item to generate a corresponding decoded image data item.

The image data compressor and/or image data decompressor may be embodied in hardware on an integrated circuit.

The image data compressor and/or decompressor may be embodied in hardware on an integrated circuit. There may be provided a method of manufacturing, at an integrated circuit manufacturing system, an image data compressor and/or decompressor. There may be provided an integrated circuit definition dataset that, when processed in an integrated circuit manufacturing system, configures the system to manufacture an image data compressor and/or decompressor. There may be provided a non-transitory computer readable storage medium having stored thereon a computer readable description of an integrated circuit that, when processed, causes a layout processing system to generate a circuit layout description used in an integrated circuit manufacturing system to manufacture an image data compressor and/or decompressor.

There may be provided an integrated circuit manufacturing system comprising: a non-transitory computer readable storage medium having stored thereon a computer readable integrated circuit description that describes the image data compressor and/or decompressor; a layout processing system configured to process the integrated circuit description so as to generate a circuit layout description of an integrated circuit embodying the image data compressor and/or decompressor; and an integrated circuit generation system configured to manufacture the image data compressor and/or decompressor according to the circuit layout description.

There may be provided computer program code for performing any of the methods above. There may be provided non-transitory computer readable storage medium having stored thereon computer readable instructions that, when executed at a computer system, cause the computer system to perform any of the methods above.

The above features may be combined as appropriate, as would be apparent to a skilled person, and may be combined with any of the aspects of the examples described herein.

BRIEF DESCRIPTION OF THE DRAWINGS

The present disclosure will now be described by way of example with reference to the accompanying drawings. In the drawings.

Where appropriate, like reference numerals have been used to denote like components.

DETAILED DESCRIPTION

Figure 1:
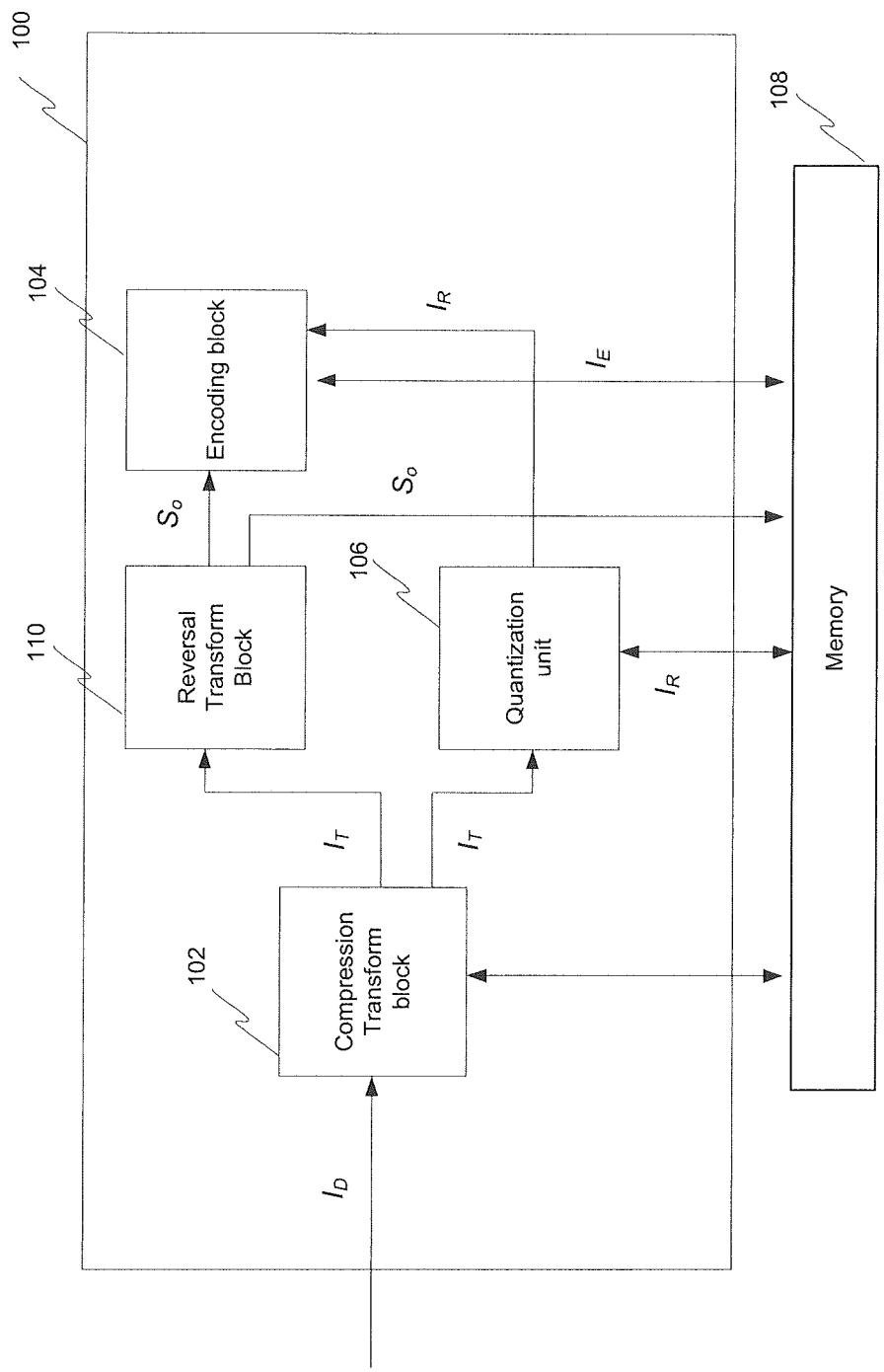
FIG. 1 shows a schematic illustration of an image data compressor for compressing image data.

The following description is presented by way of example to enable a person skilled in the art to make and use the invention. The present invention is not limited to the embodiments described herein and various modifications to the disclosed embodiments will be apparent to those skilled in the art.

There is provided a method and apparatus for compressing and decompressing image data. The image data may comprise a set of image data items each representing a position in image-value space. Thus, each item of image data may contain information defining an image value. The set of image data items defines a first occupied region of value space. The image data could for example be texture data, and the image values may be texel values for blocks of one or more texels. The image data could alternatively be colour data specifying pixel values of an image (e.g. a rendered image), and the image values may be the pixel values for blocks of one or more pixels forming the image. One example of an image-value space is a colour space, and each image data item may represent a position in the colour space so that each item of image data represents one or more colour values, the set of image data items thereby defining an occupied region of colour space. The colour space could be an RGB space, an RGBα space, a YUV space etc. Thus, each item of image data may contain colour data for a respective block of one or more texels or pixels that represents at least one colour, or colour value, associated with the respective block. Each item of image data may as such be in the form of an n-tuple, or vector. In other examples, image item might represent colour data for a plurality of pixels or, alternatively, a sub-region of the parent colour space.

As part of the image data compression, a series of transforms are selectively applied to subsets of the initial image data items to generate a transformed set of image data items that occupies a compressed, or compacted, region of value space relative to the first region. That is, each of the series of transforms is applied to a respective subset of the image data items. In the example that the items of image data each represent positions in a colour space, this step of applying a series of transforms to the set of data items forming the image data may be viewed conceptually as 'folding' the region of colour space occupied by the image data. This folded region of colour space is spanned, or occupied, by the transformed set of image data items and is reduced in extent relative to the region of colour space occupied by the initial image data. A set of reference items of data (e.g. representing a set of positons in value space) is then identified that quantizes the compressed region in value space occupied by the transformed set of image data items. Continuing the example that the items of image data represent positions in colour space, this set of reference values may be viewed as a quantization of the folded region of colour space spanned by the transformed image values. A fixed set of decompression transforms may then be identified. In one example the fixed set of decompression transforms is an ordered set of transforms that, when selectively applied to the transformed set of image data items, reverses the compression of the occupied region of value space (e.g. colour space) caused by applying the series of transforms. That is, the ordered set of transforms can be applied to the transformed set of image data items to re-generate the initial set of data items. Continuing the example in which the value space is a colour space, the set of ordered transforms can be viewed conceptually as the transforms that, when applied to the transformed set of data items, 'unfold' the folded region of colour space so that the image values represented by the data items again span the region of colour space occupied by the initial image values. Another way of expressing this is that the ordered set of transforms may be applied to the transformed set of image data items to 'undo' the effect of the series of transforms applied to the initial set of image data items.

Not every transform in the series of transforms is applied to each item of image data when folding the region of value space occupied by the image data. Thus in order to 'unfold' the occupied region of value space, not every transform from the fixed set of decompression transforms needs to be applied to each item of data in the transformed set of data items. Therefore for each image data item, a sequence of transforms from the fixed set of decompression transforms may be identified that generates an approximation of that image data item when applied to a selected one of the set of reference data items. The "selected one" of the set of reference data items may for example be the reference data item of the set of reference data items which most closely represents the transformed data item corresponding to the particular image data item to be approximated. The sequence of decompression transforms may reverse the effects of the compression transforms applied to that image data item during the folding of value space. An encoded image data item may then be generated for each item of (un-encoded) image data that represents the identified sequence of transforms for that data item. The fixed set of transforms, set of reference data items and plurality of encoded data items are then stored as compressed image data. By storing information indicating a sequence of transforms for each image data item, rather than storing the items of image data themselves, the image data may be stored in a compressed format. This may be the case even when including the storage of the set of reference values and fixed set of decompression transforms. That is, the bit-saving potentially gained by storing the transforms instead of each image data item may outweigh the bit-cost of having to store the set of transforms and the set of reference values.

As part of the image data decompression, the encoded image values are effectively decoded to re-generate the decompressed image data. To decompress the compressed image data, each encoded item of image data formed during the compression stage may be used to apply the sequence of transforms identified by that encoded data item to a reference data item. The reference value may be from the set of reference values generated during the compression stage. The sequence of transforms identified by the encoded value is applied to the reference value to transform the reference value to a decoded image value. That is, the sequence of transforms represented by that encoded value is applied to a reference value to re-generate the corresponding decompressed image value, or an approximation of it.

This stage may be viewed conceptually as unfolding the compacted region of value space generated during the compression stage. Because the sequence of transforms are applied to a quantized representation of the compacted region of value space, the decoded value generated from a given encoded value may not exactly match the image value that was encoded to be represented by that encoded value (though of course in some instances it may do). That is, the decompression process may generate image data that matches, or closely resembles, the image data that was compressed during the compression stage. This may be expressed by saying that the decompressed image data corresponds to the original image data that was compressed and encoded in the set of encoded data items.

FIG. 1 shows an example of an image data compressor 100. The compressor 100 is configured to compress image data comprising a plurality of items of image data. The compressor comprises a compression transform block 102, an encoding block 104, a quantization unit 106 and a reversal transform block 110. The compressor is shown coupled to a memory 108. The memory 108 is shown separate from the compressor, but in other examples it may form part of the compressor. A first input of the compression transform block is configured to receive image data comprising an initial set of items of image data (e.g. uncompressed image data). This image data is denoted $I_D$. Each item of image data denotes a position in a value space and so represents an image value. The positions in value space represented by the set of image data items spans a first region (which may be referred to as an uncompressed region of value space). The compression transform block may be configured to receive the image data from memory. This could be memory 108 or a separate memory (not shown).

A first output of the compression transform block is coupled to a first input of the reversal transform block. A second output of the compression transform block is coupled to a first input of the quantization unit. A first output of the reversal transform block is coupled to a first input of the encoding block. A first output of the quantization unit is coupled to a second input of the encoding block. The encoding block further has an input/output interface (I/O) coupled to a first input/output of the memory. The quantization unit has an input/output coupled to a second input/output of the memory, and the compression transform block has an input/output coupled to a third input/output of the memory. The memory may be coupled to the remaining blocks and units of the compressor 100 via a bus to allow bi-directional data transfer therebetween.

The initial set of image data items forming the image data $I_D$ may represent colour data. In particular, the value space may be a colour space and each item of image data may specify a point, or position, in the colour space. Each item of image data may as such represent a colour value. The image data may for example be texture data, or a subset, or part, of the texture data. An item of image data may represent one or more colour values. A colour value may comprise one or more components with each component having an associated value such that a single colour value comprises multiple component values. For example, a single colour value may contain four colour components (e.g. a red component, a green component, a blue component and an alpha component). This may be denoted mathematically in general as $C=c_1, c_2 \ldots c_n$, where C denotes the colour value (in this case with n components), and $c_1, c_2 \ldots c_n$ represent n colour components that form the colour value.

Each item of image data representing a colour value may therefore be in the form of a tuple, or vector, comprising a plurality of elements, with each element representing a value for a respective colour component. Colour values may comprise a group, or set, of colour components. For example, two colour values, denoted $C_1$ and $C_2$ may both comprise R, G, B and α components. Values for corresponding components of different colour values may of course differ. In the case that an image data item contains information representing two or more colour values, that information may be represented as a tuple comprising a first set of elements representing colour components for the first colour value, a second set of elements representing the colour components for the second colour value, and so on. That is, each image data item representing colour data may be a tuple with components $(c_1^1, c_n^1, c_1^2, \ldots c_n^2, \ldots, c_1^m \ldots c_n^m)$, where the subscript index denotes the colour component, 'n' denotes the number of colour components forming a single colour value, the superscript index indexes the colour value and cm' denotes the number of colour values represented by the image data item. Each component of the tuple may represent a colour 'channel', where a channel is a particular colour component for a particular set of colour values. As a specific example, each item of image data value may be a vector that represents two RGBα colour values in the form $(R^1, G^1, B^1, \alpha^1, R^2, G^2, B^2, \alpha^2)$. In other example cases, the components in the tuple may represent less regular selections of properties. For example, each tuple may specify values for a mixture of RGB and YUV components, such as $(R^1, G^1, Y^1, V^1)$. It will be appreciated that any selection of colour properties is possible.

If colour values can be represented as a tuple, the set of colour values contained within the image data $I_D$ may represent positions within a colour space defined by a set of (orthogonal) axes, where each axis may corresponds to a different colour channel. Each element of the tuple specifies a value along a corresponding axis. As an example, a set of RGBα colour values may be represented as points within an RGBα colour space defined by an R, G, B and α axis (i.e. a four dimensional space). In a further example, a set of RGBα colour pairs may be represented as points within an 8-dimensional space defined by an $R_1, G_1, B_1$ and $\alpha_1$ axis and an $R_2, G_2, B_2$ and $\alpha_2$ axis, so that a position within the eight dimensional colour space specifies two colour values (and eight colour channels). It will be appreciated that an image data item may represent any number of colour values in an analogous manner by specifying a position within a general n-dimensional colour space.

Figure 2:
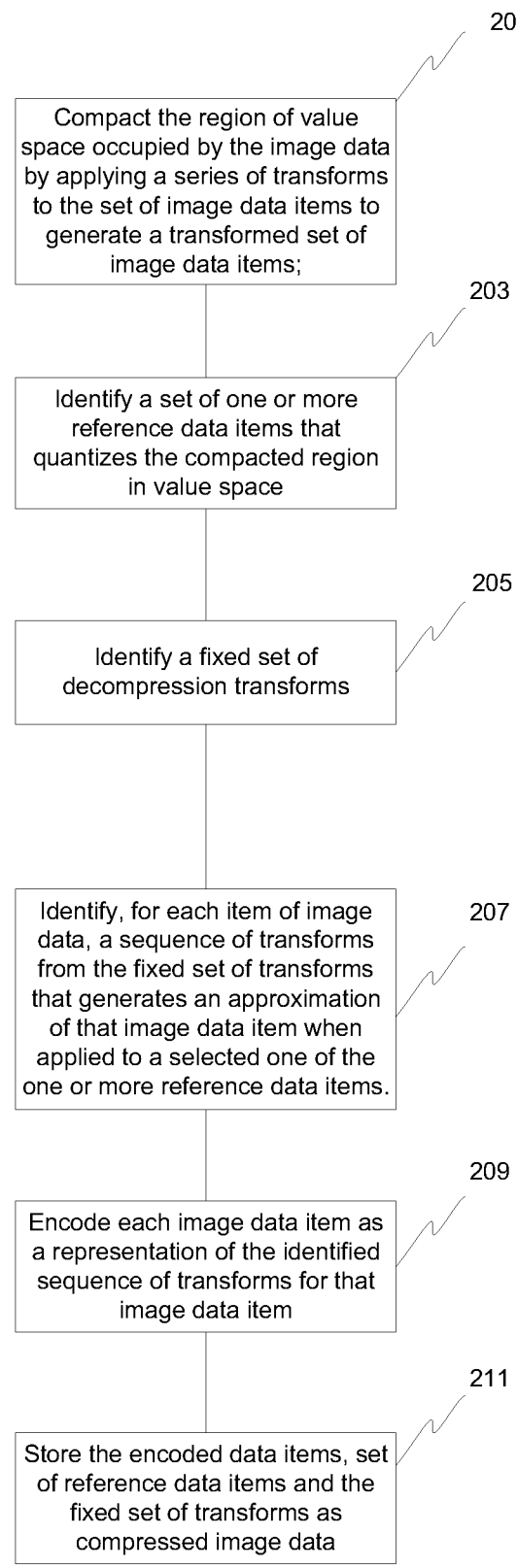
FIG. 2 is a flow chart illustrating an example series of steps performed by the image data compressor to compress image data.

The operation of the image data compressor to compress the image data $I_D$ will now be described with reference to the flow chart in FIG. 2.

Figure 4:
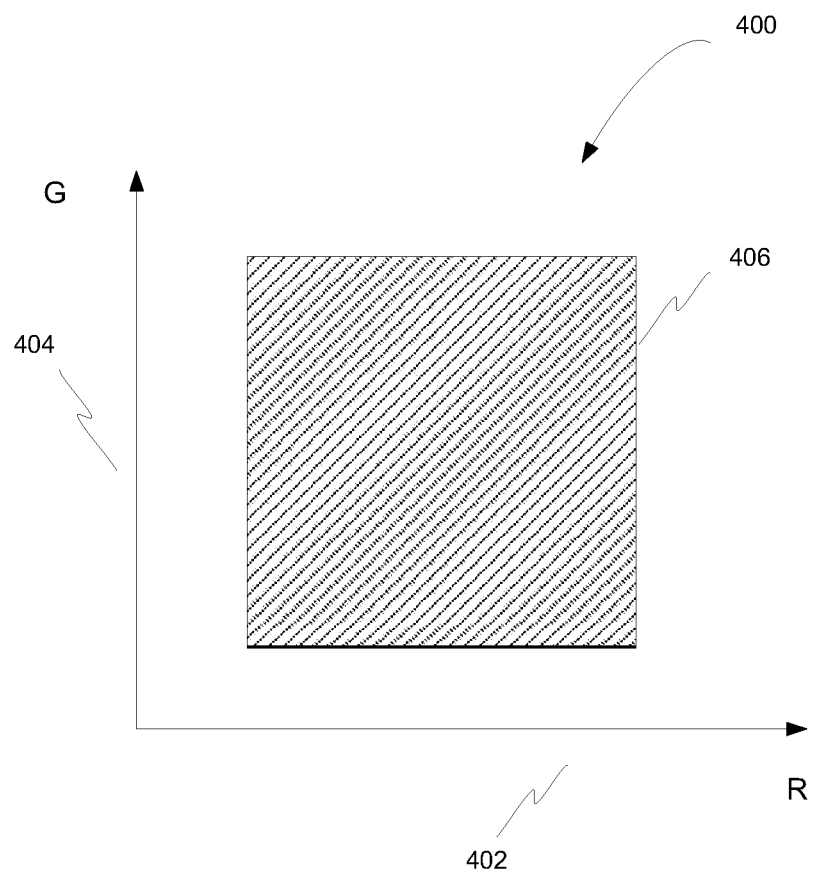
FIG. 4 shows a region of an example colour space occupied by image data to be compressed.

For ease of illustration, in this example each item of image data in the image data $I_D$ represents a single colour value comprising two colour components: a red component and a green component. That is, in this example the image data contains colour data for two colour channels. Each item of image data may therefore be a vector with components (R, G) that specifies a point within a colour space. This colour space is illustrated in FIG. 4 and denoted generally at 400 and is an example of a more general image-value space. Although the colour space in this example is two-dimensional, it will be appreciated that this is an example only, chosen for ease of illustration. In general the colour space may be n-dimensional (n≥1), The colour space 400 is defined by an R axis 402 and a G axis 404. A point, or position, within the colour space specifies the values of the red and green components for a particular colour value. A bound region 406 depicts the distribution of colour values in the colour space represented by the set of image data items in the uncompressed image data $I_D$. The bound region may therefore be said to depict the region of colour space occupied by the image data $I_D$. The shape of the bound region is determined by the distribution of colour values in the image data—it is shown as a square in this figure merely for ease of illustration. In addition, although only a single bound region is shown in FIG. 4, in other examples the distribution of colour values may be such as to give rise to two or more disjoint clusters in colour space (i.e. two or more separate bound regions).

Although the bound region is shown in FIG. 4 as being a continuous region, this is for the purposes of illustration and it will be appreciated that the occupied region of colour space would in practice comprise a set of discrete points. However, because in practice the number of discrete points would likely be large for a given set of image data $I_D$, the set of points in the colour space may be approximated, or modelled, as one or more occupied regions of colour space. The occupied region may be characterised as one or more surfaces if the colour space is two-dimensional (e.g. region 406) or more generally as one or more n-dimensional volumes (if the colour space has three or more dimensions). The envelope of the occupied region may bound all the image values in the image data, or it may only bound those image values lying within a relatively well-defined region of colour space (e.g. image values that represent statistical outliers for the image data may not be bound by the envelope of the occupied region). An occupied region may for example be determined for a given distribution of data points by performing a cluster analysis, such as density-based clustering.

Figure 9:
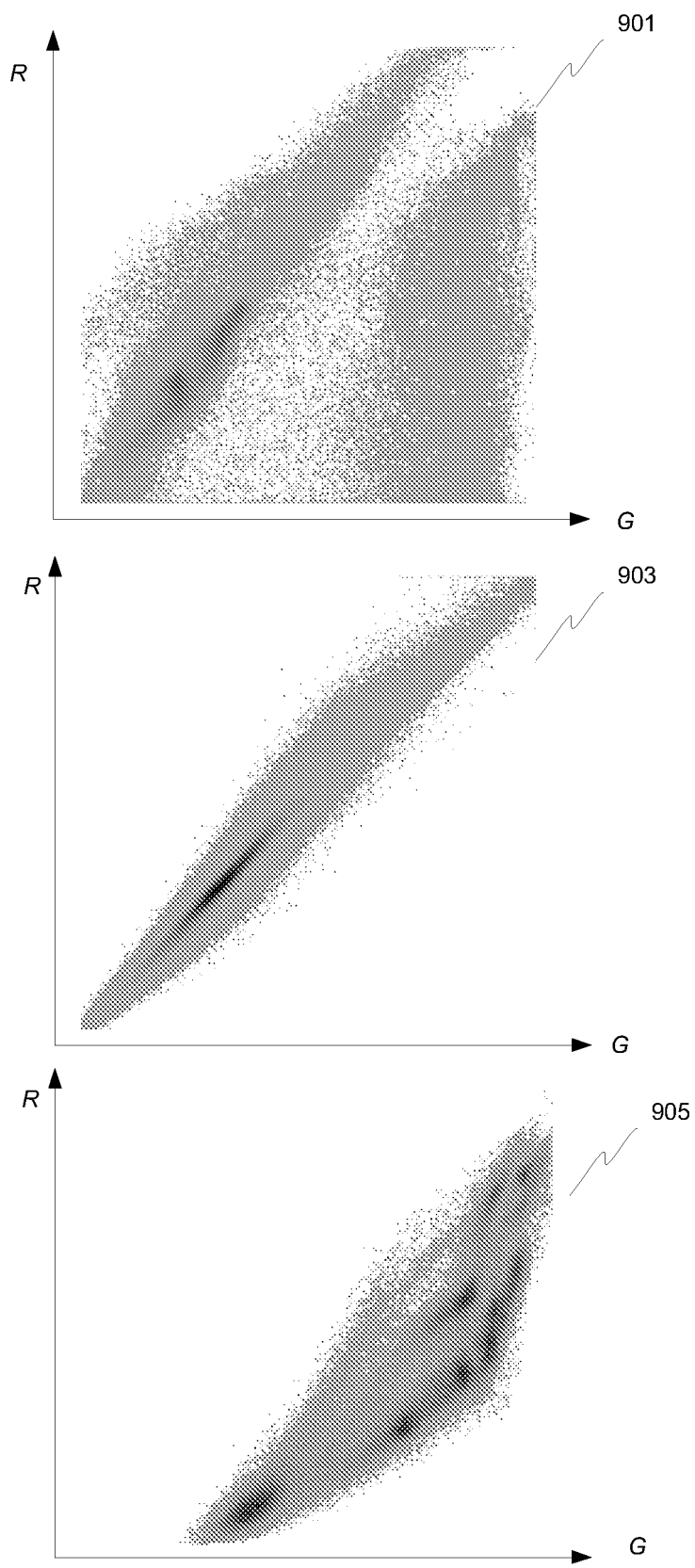
FIG. 9 shows examples of regions of colour space occupied by image data for three images.

To illustrate how the distribution of colour values may appear in practice, FIG. 9 shows the colour distributions obtained from an analysis of three different images. The colour spaces are shown at 901, 903 and 905 and show the distribution of red vs green values for the different respective images. It can be seen that the first distribution 901 can be approximated as two disjoint clusters, whereas the distributions 903 and 905 would be more accurately modelled as a single cluster. The darker regions of each cluster represent a higher concentration of occupied positions in the colour space.

Returning back to FIGS. 2 and 4, at step 201 the compression transform block 102 applies a series of transforms, each of which is applied to a respective subset of the set of image data items, to generate a transformed set of image data items that occupies a compacted region in colour space relative to the region of colour space occupied by the image data $I_D$ (i.e. the region depicted at 406). That is, the image values represented by the transformed set of image data items span a more compact region of colour space compared to the image values represented by the data set $I_D$. Each transform in the series may be applied to a different subset of data items. This series of transforms may as such be referred to as a compacting series of transforms, and the transforms may be referred to as compression transforms. The transformed set of image data items are denoted $I_T$ and are output by the compression transform block to the reversal transform block 110 and quantization unit 106. Each item of image data in the set $I_D$ therefore corresponds to an item of image data in the set $I_T$.

A transform may be performed on an item of image data by performing a matrix multiplication on that data item. For example, a transform on a tuple, or vector, of data may be represented as:

$$\begin{pmatrix} c_1^{1'} \\ c_2^{1'} \\ \vdots \\ c_3^{2'} \\ c_4^{2'} \end{pmatrix} = \begin{bmatrix} m_{11} & m_{12} & \cdots & m_{18} & m_{19} \\ m_{21} & m_{22} & \cdots & m_{28} & m_{29} \\ \vdots & \vdots & \ddots & \vdots & \vdots \\ m_{71} & m_{72} & \cdots & m_{77} & m_{78} \\ m_{81} & m_{82} & \cdots & m_{87} & m_{88} \end{bmatrix} \begin{pmatrix} c_1^1 \\ c_2^1 \\ \vdots \\ c_3^2 \\ c_4^2 \end{pmatrix}$$

Here the tuple $(c_1^1, c_2^1 \ldots c_4^2)$ is an item of image data that represents a pair of colour values prior to the transformation, and the tuple $(c_1^{1'}, c_2^{1'} \ldots c_4^{2'})$ is a transformed image data item that represents the pair of colour values following the transformation. A transform may viewed as an operation that causes at least one value in the data it is operating on to change. Under this view, applying the identity matrix may not be considered as applying a transform because the identity matrix, by definition, leaves the data it is operating on unchanged.

Alternatively the colour space may be expressed in homogeneous coordinates wherein an additional dimension is included. This permits matrix operations to perform additional transformations such as translation in "one step". For example, if an N-tuple $(c_1, \ldots c_n)$ is logically represented as the N+1-tuple, $(c_1, \ldots c_n, 1)$, then the $(N+1) \times (N+1)$ matrix $$\begin{pmatrix} m_{1,1} & m_{1,2} & \cdots & m_{1,n} & t_1 \\ m_{2,1} & \cdots & & m_{2,n} & t_2 \\ \vdots & & \ddots & \vdots & \vdots \\ m_{n,1} & & & m_{n,n} & t_n \\ 0 & 0 & \cdots & 0 & 1 \end{pmatrix}$$

would also perform an additional translation by $(t_1, \ldots t_n)$. If required, multiple matrix operations can then be combined by standard matrix multiplication into a single matrix. Note that this is a logical representation and values that are always constant, such as 0 or 1, need not actually be stored.

The compression transform block may perform the series of transforms sequentially. Applying each of the series of transforms to respective subsets of the set of image data items in the data $I_D$ may transform an item of image data specifying a first position in colour space to a transformed image data item specifying a second position in colour space. That is, an item of image data in the data set $I_D$ and its corresponding transformed data item in the data set $I_T$ may specify different points in colour space.

Figure 5:
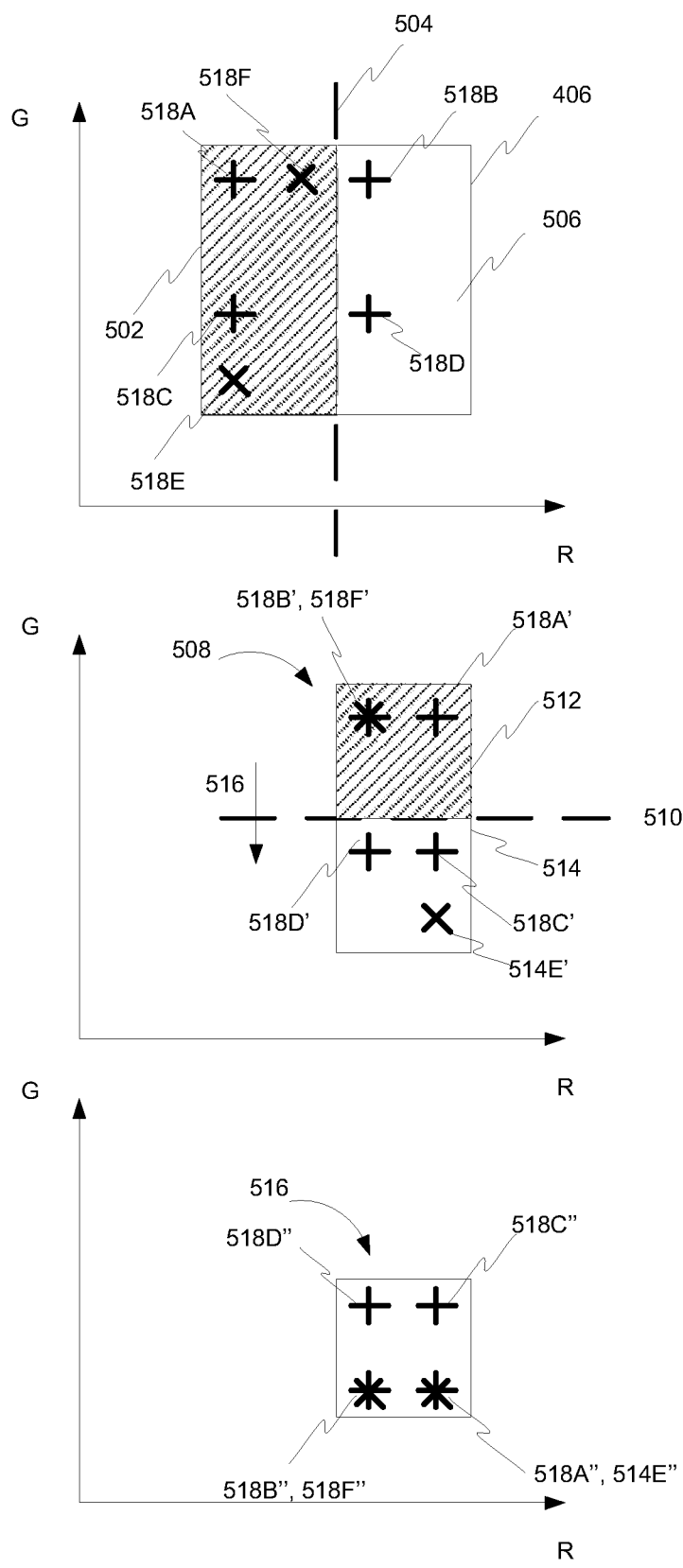
FIG. 5 shows the region of colour space occupied by the image data being compacted as a result of the application of a series of transforms to the image values composing the image data.

Applying the series of transforms in this way effectively reduces the size, or extent, of the region of colour space occupied by the image data items. The transforms may therefore be viewed conceptually as 'folding', or compressing, the occupied region of colour space. An example of such a series of transforms for folding the region of colour space 406 is illustrated in FIG. 5. The positions in colour space specified by six example image data items A, B, C, D, E and F are shown at $518_A$, $518_B$, $518_C$, $518_D$, $518_E$ and $518_F$ respectively.

As a first step, a line 504 through the region 406 is determined that partitions the region into two sub-regions denoted 502 (indicated by the dashed markings) and 506. Thus the set of image data items are partitioned into two subsets. In the example, the line 504 is shown midway through the data set, but in general the position would be chosen as to best aid the compressed representation. As explained above, the colour space in this example is 2-D to aid illustration, but in practice may be any n-dimensional space. Line 504 is thus an example of a more general hyperplane (i.e. a subspace of one less dimension (n−1) than the ambient n-dimensional space).

A first transform is then applied to the subset of image data items that represent positions in the colour space situated within sub-region 502 to reflect those data items about line 504 so that the set of data items originally specifying a position in region 502 now approximately coincide with region 506. In this example the regions match exactly but that is not typical. This first transform may be viewed conceptually as folding the sub-region 502 onto sub-region 506 about the line 504. The occupied region of colour space following this first round of transformations is shown at 508. The positions of the six image data items A, B, C, D, E and F following the first transform are shown at $518_{A'}$, $518_{B'}$, $518_{C'}$, $518_{D'}$, $518_{E'}$ and $518_{F'}$ respectively. It is noted that this transform has caused the data items B and F to be coincident in the colour space, i.e. both of these data items now specify the same position in colour space.

Region 508 is shown as being partitioned by line 510 that divides the region into sub-regions 512 (indicated by dashed markings) and 514. Again, line 510 is an example of a more general hyperplane, which in this example is chosen to bisect the region 508 but in general (e.g. for more complex distributions) is chosen to best aid the compressed representation. A second transform is then applied to the subset of image data items that specify positions in the colour space situated within the region 512 to reflect those data items about the line 510. This transform may be viewed conceptually as folding the occupied region of colour space 512 onto region 514 about the plane 510. The occupied region of colour space following this second transform is shown at 516 and is spanned by the transformed set of image data items $I_T$. The positions specified by the image data items A-F following the second transform are shown at $518_{A''-F''}$ respectively. It is noted that the image data items B and F specify coincident positions in the colour space as do the data items A and E. This serves to illustrate how the number of different positions in colour space occupied by the set of data items following the transforms may (as in this example) be less than that occupied by the data items prior to the transforms being applied.

The planes (and associated axes perpendicular to the planes) about which to fold the colour space (e.g. planes 504 and 510) may be determined by the compression transform block 102. The compression transform block may for example process the set of image data items by performing a principal component analysis. This may be a particularly useful technique for determining the orientation and position of the axes/hyperplanes when the value space is n-dimensional with n≥2. It may also be a useful technique when the occupied region of value space is a more general shape and not a more simple geometric shape such as is illustrated in FIG. 5. The compression transform block may perform a principal component analysis on the set of image data items to determine a direction in value space along which there is the widest distribution of image values. This direction may be referred to as a principal axis. A partitioning plane (in general a hyperplane) may then be chosen that is perpendicular to the principal axis. The compression transform block may determine the position of the fold plane with respect to the principal axis from an analysis of the distribution of image values along the principal axis. The position of the fold plane may vary depending on the distribution of image values within the colour space, as well as on what stage the folding process has reached. For example, if the distribution of image values is relatively tight, or compact, the occupied region of colour space may be halved (or approximately halved) by positioning the fold plane such that approximately half of the image values are on either side of the fold plane. Alternatively, the position of the partition plane may be chosen (out of all possible positions of the partition plane along the associated axis), so that, given the resulting image value sets A and B, the total sum of the squared distances of each value of set A to the average value of set A, denoted $\overline{A}$, plus the total sum of the squared distances of the values of B to the average value of set B, denoted $\overline{B}$, is minimised. Note that if N is the total number of image values this minimisation operation can be achieved with only O(N log N) cost.

If the image data items occupy disjoint clusters in colour space, e.g. a larger cluster and a smaller, satellite cluster, the compression transform block may choose a partition and operation that transforms the small cluster to overlap the larger cluster (or vice-versa). Transforms can then be applied to compress, or fold, the single cluster. If instead transforms were applied to fold the larger cluster before folding the satellite cluster onto the larger cluster, the satellite cluster may just be reflected about colour space with little resulting compression of the occupied region. Because the shape of the occupied region may change with each compression transform, the compression transform block may perform principal component analysis on the set of image values after each transform has been applied in order to determine the next transform in the series.

Other spatial partitions that may suit certain data distributions include separating based on a distance from a given point (i.e. a hyperspherical boundary) or an alternative metric. Alternatively, rather than use a spatial partition, approaches which may involve overlapping regions may be chosen. For example, consider a cloud of colour values where, say, for each of a significant portion of those colour values, there is another colour value that is offset by a small, approximately constant, displacement. Those displaced colour values could be placed into their own set and the displacement used to 'fold' them onto the remainder.

When a transform of the series is being applied, the same transform is applied to each image data item that is subject to that transform in the series. For example, when the first transform described above is applied, the same transform is applied to each image data item that represents a point within region 502 of the colour space. That is, the same matrix may be applied to each vector for which a transform of the series is to be applied. It will be appreciated however that although the series of transforms is applied to the set of image data items as a whole (e.g. to fold the region of colour space 406 to the compressed region 516), the same sequence of transforms are not necessarily applied to each image data item. For example, for the series of transforms shown in FIG. 5, the first transform is only applied to the subset of image data items that specified positions within region 502 of the colour space; the first transform is not applied to the remaining subset of image data items representing positions within region 506 of the colour space. Similarly, the second transform is only applied to the subset of image data items representing positions within region 512 of the colour space. Using the six items of image data A-F as an example, items A and F are subject to the first and second transforms; item B is subject to the second transform but not the first; items C and E are subject to the first transform but not the second; and item D is not subject to either transform.

The above example illustrates how each of a series of transforms can be applied to respective subsets of image data items in the image data $I_D$ so as to reduce the size, or extent, of the region of colour space occupied by that data. This may alternatively be expressed by saying that the transforms are applied to the set of image data items of data $I_D$ to compress, or compact, the region of colour space occupied by the image data items compared to the region occupied prior to the transforms being applied. Reducing the extent of the occupied region of colour space defined by the image values may enable the occupied region of colour space to be accurately represented using vector quantization with only a limited number of vectors. This will be explained in more detail below.

At step 203, the quantization unit 106 identifies a set of one or more reference data items that quantize the compacted region of colour space (in this example region 516). This process is illustrated with reference to FIG. 6, which shows the compacted region of colour space 516 formed from applying the compression series of transforms to the set of image data items $I_D$ from step 201. This set of reference data items are denoted $I_R$.

It will be appreciated that the compacted region 516 may represent the image values specified by the same number of image data units as that of the initial occupied region of colour space 406 (though the number of different values specified by the image data items following compression is fewer). In order to reduce the storage requirements of the image data, it may be desirable to quantize the compacted region of colour space by storing a set of reference data items that represent the compacted region in a reduced resolution. As has been mentioned above, it will be appreciated that the compacted region of colour space may in practice be formed of a set of discrete points. As such, quantizing the compacted region of colour space may refer to representing the compacted region with a reduced number of data items (i.e. at a coarser granularity) than that which are contained within the compacted region prior to quantization. Each reference data item may therefore specify a position in colour space (and in particular a position within the compacted region) and so represent a reference value. That is, each reference value may represent one or more colour values within the folded colour space. Each reference data item may therefore be in the form of a vector, or tuple (e.g. a four or 8-tuple) where each element of the tuple/vector specifies a value for a particular colour component, or colour channel.

It has been realised that due to the smaller region of colour space occupied by the transformed set of image data items, the compacted region of colour space may be accurately represented with a relatively small number of reference tuples, or vectors.

Figure 6:
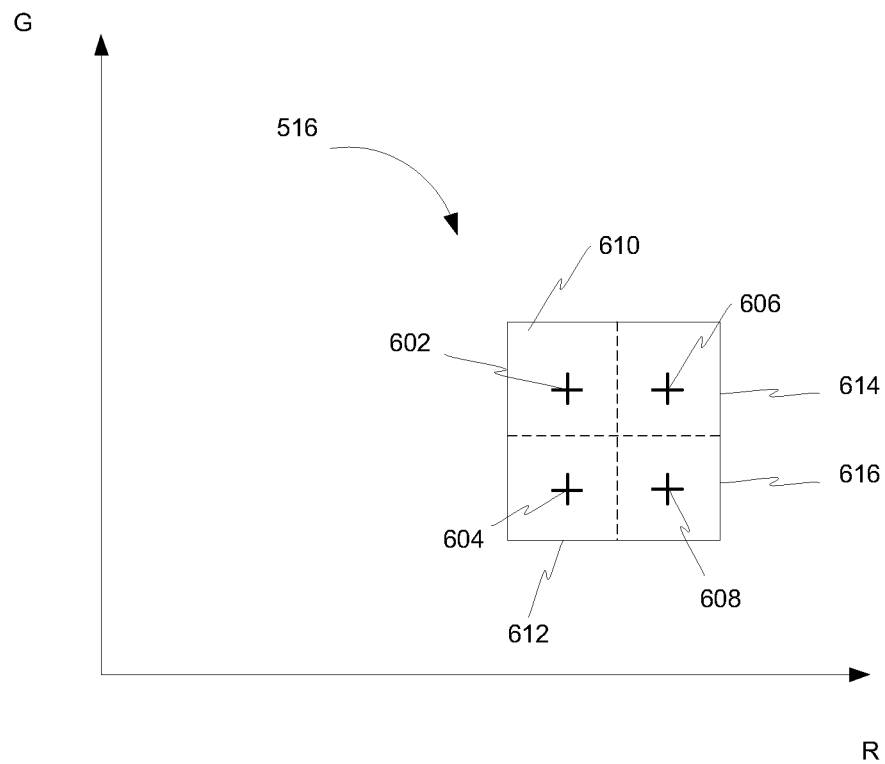
FIG. 6 shows a set of reference values selected to quantize the compacted region of colour space.

The positions specified by an example set of reference data items A', B', C' D' that quantize the compacted region of colour space 516 are shown in FIG. 6 at 602, 604, 606 and 608 respectively. It will be appreciated that the number of reference items shown in FIG. 6 is merely an example and that the number of reference data items may be readily chosen or determined as an implementation detail. In some cases, the compacted region of colour space may be quantized using a single reference data item. The more transforms or folds that are applied, the smaller the compacted region of colour space may become and the more likely it is that the compacted region can be approximately represented with a single reference data item. In a practical implementation, in order to optimise the compression of the data a balance may need to be struck between the cost of applying a greater number of transformations to more tightly fold the data (which each need to be stored), and the gain of reducing the number of reference data items required to quantize the folded data. For certain data sets there may be a point where the cost of storing additional reference data items is cheaper than storing the additional transforms to further compact the colour space.

As part of quantizing the compacted region of colour space, the quantization unit 106 may associate subsets of data items in the set $I_T$ with a respective reference data item (including the situation in which all of the data items in the set $I_T$ are associated with a single reference data item). The quantization unit 106 may do this by determining regions around each reference value that partition the compacted region of colour space (e.g. Voronoi regions). Each item of image data that specifies a position in colour space within a given region may then be associated with the reference item located in that region. For example, in FIG. 6, the compacted region of colour space is partitioned into four regions 610, 612, 614 and 616 (delineated by the dashed markings) that encompass reference values 602-608 respectively. Each item of image data that specifies a position in colour space located within region 610 is associated with reference item A'; each image data item that specifies a position in colour space located within region 612 is associated with reference item B'; each image data item that specifies a position in colour space located within region 614 is associated with reference item C'; and each image value that represents a position in colour space located within region 616 is associated with reference value D'.

The reference items $I_R$, and the regions that partition the compacted region of colour space, may be determined by the quantization unit 106 using an algorithm for vector quantization, such as a clustering algorithm. The regions and reference items may be determined iteratively using the algorithm, but the number of reference items used to quantize the compacted region may be predefined or implementation specific.

The set of reference items chosen by the quantization unit 106 may be referred to as a codebook.

At step 205, the reversal transform block 110 identifies a fixed set of decompression transforms.

The set of decompression transforms may be transforms that, when selectively applied to the transformed set of data items $I_T$, reverses, or approximates the reversal of, the compaction of the occupied region of colour space that is caused by applying the compacting series of transforms to the initial set of image data items in the image data $I_D$. Thus each decompression transform in the set may reverse the effect of a corresponding compression transform in the series of compression transforms. The set of decompression transforms may therefore effectively regenerate the initial set of image data items from the transformed set of image data items. The transforms may be ordered in the sense that the transforms in the set are applied in a specific order. That order may be fixed so that it is not possible to apply the transforms in a different order to that specified. The set of decompression transforms are denoted $S_O$ and are output from the reversal transform block to the encoding block 104.

Referring to our current example, the set of decompression transforms, when applied to the transformed set of image data items $I_T$, unfolds the region of colour space 516 occupied by the transformed image data items back to the unfolded region 406. The ordered set of transforms in this case may therefore consist of: 1) a reflection about line 510; and 2) a reflection about the line 504.

The fixed set of decompression transforms may be determined from the series of compression transforms applied to fold the occupied region of colour space. The set of decompression transforms may be described as the inverse set of transforms to the series of compression transforms, or equivalently, each decompression transform in the set of decompression transforms is the inverse transform of a corresponding transform in the series of compression transforms.

The set of decompression transforms may alternatively be predetermined, i.e. the reversal transform block may have access to a predetermined set of transforms. In this case the reversal transform block may not actively identify the set of decompression transforms (since they will be predetermined), but instead it may determine parameters for each of the transforms in the set. This may reduce the complexity of the compression process. Thus step 205 may not be an active step of the compression process.

The series of compression transforms and the set of decompression transforms are transforms applied to the set/transformed set of image data items as a whole. Just as it may be the case that each compression transform in the series is applied to a respective subset of the image data items during colour space folding (i.e. not every transform in the compacting series of transforms is applied to each image data item during the colour space folding), it may also be the case that each decompression transform in the set $S_O$ is applied to a respective subset of the transformed image data items $I_T$ to unfold the colour space (i.e. not every transform from the set of transforms $S_O$ is applied to each image data item in the transformed set $I_T$ to unfold the colour space.)

Thus at step 207 the encoding block may identify, for each initial image data item in the data $I_D$, a sequence of transforms from the fixed set of transforms that generates an approximation of that image value when applied to a selected one of the one or more reference data items.

The sequence of transforms for each image data item may be generated from the compression transforms applied to that data item. For example, the sequence of transforms identified for each image data item may be determined as the sequence that reverses the effects of the transforms applied to that data item to generate the transformed set of image data items $I_T$. In other words, the identified sequence of transforms for an item of image data may be one that reverses the transforms applied to that data item during compaction, or folding, of the colour space. The identified sequence of transforms may therefore, if applied to an item of image data in the transformed set $I_T$, transform that image data item from its position in colour space following application of the compression transforms back to its original position in colour space before the compression transforms were applied. Thus the decompression transforms may be applied in reverse order to exactly the same subsets of data items as in the compression step.

However, in examples described herein, during decoding the sequence of decompression transforms will not be applied to the transformed set of image data items but will be applied to one of the reference data items. Since the reference data item may not specify the same position in colour space as a given transformed image data item (due to the quantization), applying the sequence of transforms to the reference value may not exactly re-generate the corresponding initial image data item, but it will generate an approximation of that image data item.

For example, referring again to FIG. 5, the identified sequence of transforms for image data item A may be: 1) a reflection about fold line 510; followed by 2) a reflection about fold line 504 (i.e. the first transform in the ordered set followed by the second transform in the ordered set). This sequence transforms image data item A from position 518A" back to position 518A. During decoding however, this sequence of transforms is likely to be applied to the reference value 608, which may not be coincident with position 518A". Thus applying the sequence of transforms to value 608 will generate an image data item approximately (though possibly not exactly matching) position 518A. As another example, the identified sequence of transforms for data item C may consist only of the second transform in the ordered set (to transform item C from position 518C" to 518C), and the identified sequence of transforms for data item B may consist only of the first transform in the ordered set (to transform item B from position 518B" to 518B). In this example, no transforms are identified for image data item D.

The sequences of transforms identified for each item of image data may therefore not all be the same. However, each identified sequence is formed from the same fixed set of decompression transforms. That is, a single set of decompression transforms is used to form the sequence of transforms for each image data item. If the set of decompression transforms is an ordered set, each sequence of transforms may be formed from the selective application of each transform of the ordered set of transforms.

In the example described above, the sequence of transforms identified for each image data item was determined as the inverse transforms to the transforms applied to that image data item from the series of compression transforms. In an alternative example, the encoding block may use a different approach to identify the sequence of transforms for each image data item. The encoding block may identify a set of colours representable with the fixed set of transforms and the set of one or more reference items. This set may be the set of all representable colours for a fixed sequence length (i.e. the colours generated by applying, to each reference data item, each possible sequence of transforms of a fixed length that can be generated from the set of decompression transforms). The encoding block may then search the set of representable colours for the closest match to each colour value represented by the image data items in the initial set $I_D$. The sequence of transforms (and the reference data item) used to generate the closest colour match for each data item are then identified. Thus in this example, the identified sequence of transforms for an image data item may not be the sequence of transforms that reverses the transforms applied to that image data item during compression (i.e. it may not be the inverse to the compacting series of transforms), but it may nevertheless accurately encode that data item. This is because the identified sequence of transforms can be applied to a reference item to generate an approximation of the image data item. It will be appreciated that in this example the fixed set of decompression transforms may not be inverses of the compression transforms. They could be a predetermined set of transforms formed independently of the compression process.

In another approach to producing a sequence of transformations and set of reference items, a standard vector quantisation approach may be used on the initial set of colour values to reduce that set to a smaller set of quantised values. The folding/fitting process may then be applied to just that smaller set in order generate a selectable sequence of transformations.

At step 209, the encoding block 104 encodes each item of image data in the set $I_D$ to generate a respective encoded image data item. Each item of image data is encoded as a representation of the sequence of transforms identified for that data item during step 205. In other words, each encoded data item contains information representing the sequence of transforms identified for the image data item that is encoded by that encoded data item. The set of encoded data items are denoted IE.

Each encoded image data item may contain information representing the selective application of each transform from the set of decompression transforms $S_O$ to thereby represent the sequence of transforms identified for that image data item. That information may be in the form of a series of data units, with each data unit representing the selective application of a corresponding transform from the ordered set of transforms $S_O$. If the set of decompression transforms is an ordered set, each encoded image data item may comprise a number of such data units equal in number to the number of transforms forming the ordered set. If the set of decompression transforms is a fixed set formed independently of the compression transforms, the number of data units may be equal to the sequence length used to generate the set of representable colours.

In one low-cost implementation, each data unit may be a single bit that represents a binary value of '1' or '0'. A value of '0' for a bit may indicate that the corresponding transform from the ordered set of transforms does not form part of the identified sequence, and a value of '1' may indicate that the corresponding transform does form part of the identified sequence, or vice versa. Thus each encoded image value may contain information representing a binary string that represents the identified sequence of transforms for that image value.

Referring again to our previous example, the encoded data items for items A and F may comprise two data units representing the binary string '11' to indicate that the identified sequence for those data items contains both the first and second transforms from the ordered set of transforms. As another example, the encoded data item for image data item B may comprise two data units representing the binary string '10' to indicate that the identified sequence of transforms for that that data item contains the first transform from the ordered set of transforms but not the second transform; and the encoded data items for image data items C and E may comprise two data units representing the binary string '01' to indicate the identified sequence for those data items contains the second transform but not the first transform. The encoded data item for D may comprise two data units representing the binary string '00' to indicate that the sequence of transforms identified for that image data item contains no transforms from the ordered set of transforms.

An indication of a reference data item on which to perform the sequence of transforms may additionally be stored as part of each of the encoded image data items. That is, an index to a selected reference item may be stored within the encoded value for each image item. Each encoded value may for example contain information used to identify a reference item from the codebook, such as an indexing data unit used to index a reference item. Storing an index within the encoded value (rather than the reference item) is advantageous due to the reduced memory requirements. Thus the quantization unit 106 may additionally output the set of reference items $I_R$ to the encoding block 104. For situations in which the compacted region of colour space is represented by a single reference item, the encoded values may not contain an indexing data unit because it wouldn't be necessary.

At step 211, the set of encoded image data items IE, the set of reference items $I_R$ and the fixed set of decompression transforms $S_O$ are stored as compressed image data for the image data $I_D$. The compressed image data may be stored in memory 108. Although shown in FIG. 1 as being stored in a single block of memory, this is for the purpose of illustration only and it will be appreciated that the compressed image data may be stored across more than one memory unit. The compressed image data also need not be stored in contiguous memory blocks, though it may be. The set of decompression transforms and the identified set of reference items may be stored together as a data structure. The data structure contains the instructions to decompress the compressed image data (i.e. the set of decompression transforms) and so may be referred to herein as an 'unfolding structure'. Information on what instructions from the unfolding structure are to be used to decode an encoded image item is contained within that encoded image item.

Thus following compression, the image data $I_D$ can be stored as a set of encoded image items IE. Rather than storing the data for each image data item directly (e.g. colour values), an encoded data item can be stored that represents the sequence of transforms that need to be applied to some reference value, and if there is more than one possible reference value, that reference value or index of the reference value, in order to generate the decoded data for the image data item. The storage (e.g. the number of bits) required to store a sequence of transforms may be less than the storage required to store the decoded data for an image value. Thus the compressed image data may require a smaller amount of memory for storage than the decompressed image data. This may be the case even if the set of reference items and the ordered set of transforms are stored as part of the compressed data. Further, it has also been realised that, in many practical implementations, the image data (e.g. colour and/or texture data) can be compressed using a relatively restricted set of transformations, for example translation, scaling, skewing and/or rotation. This restricted set of transformations can be represented (and thus stored) more compactly than the storage of full $N^2$ or $(N+1)^2$ values for general N×N or N+1×N+1 transformation matrices, thus reducing the cost of storing the ordered set of transforms as part of the compressed data.

Figure 7:
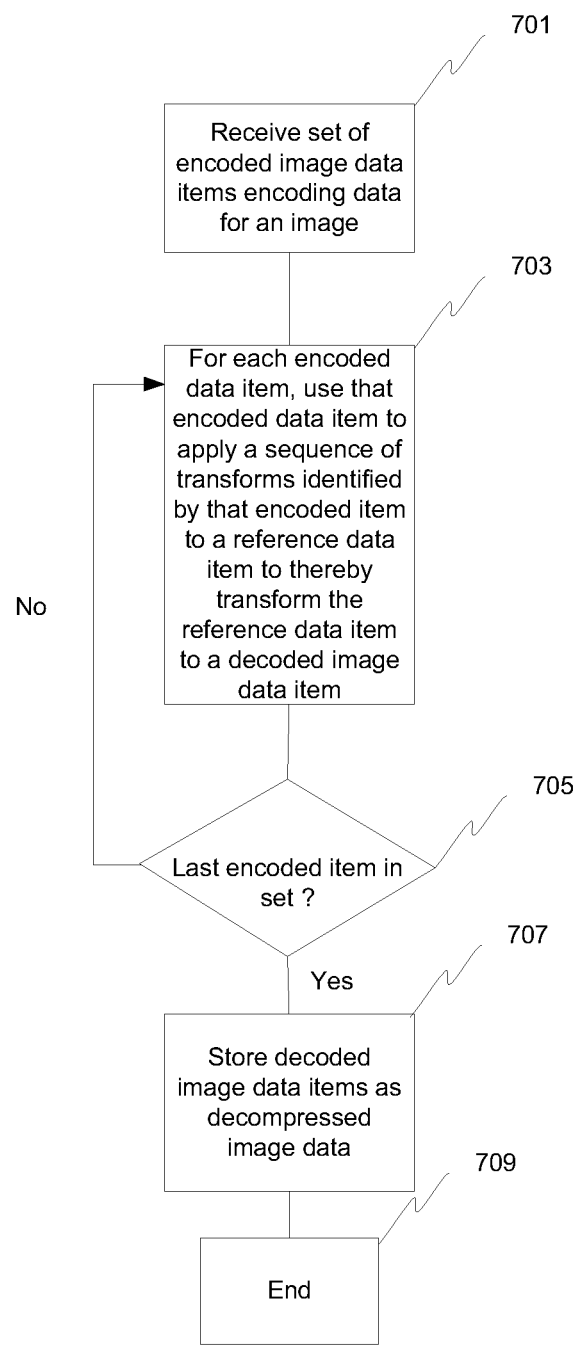
FIG. 7 is a flow chart showing an example series of steps performed by the image data decompressor to decompress compressed image data.

The process of decompressing the compressed image data will now be described with reference to FIGS. 3 and 7. For ease of illustration, this explanation will be made with continued reference to the example image data as illustrated in FIGS. 4 to 6.

Figure 3:
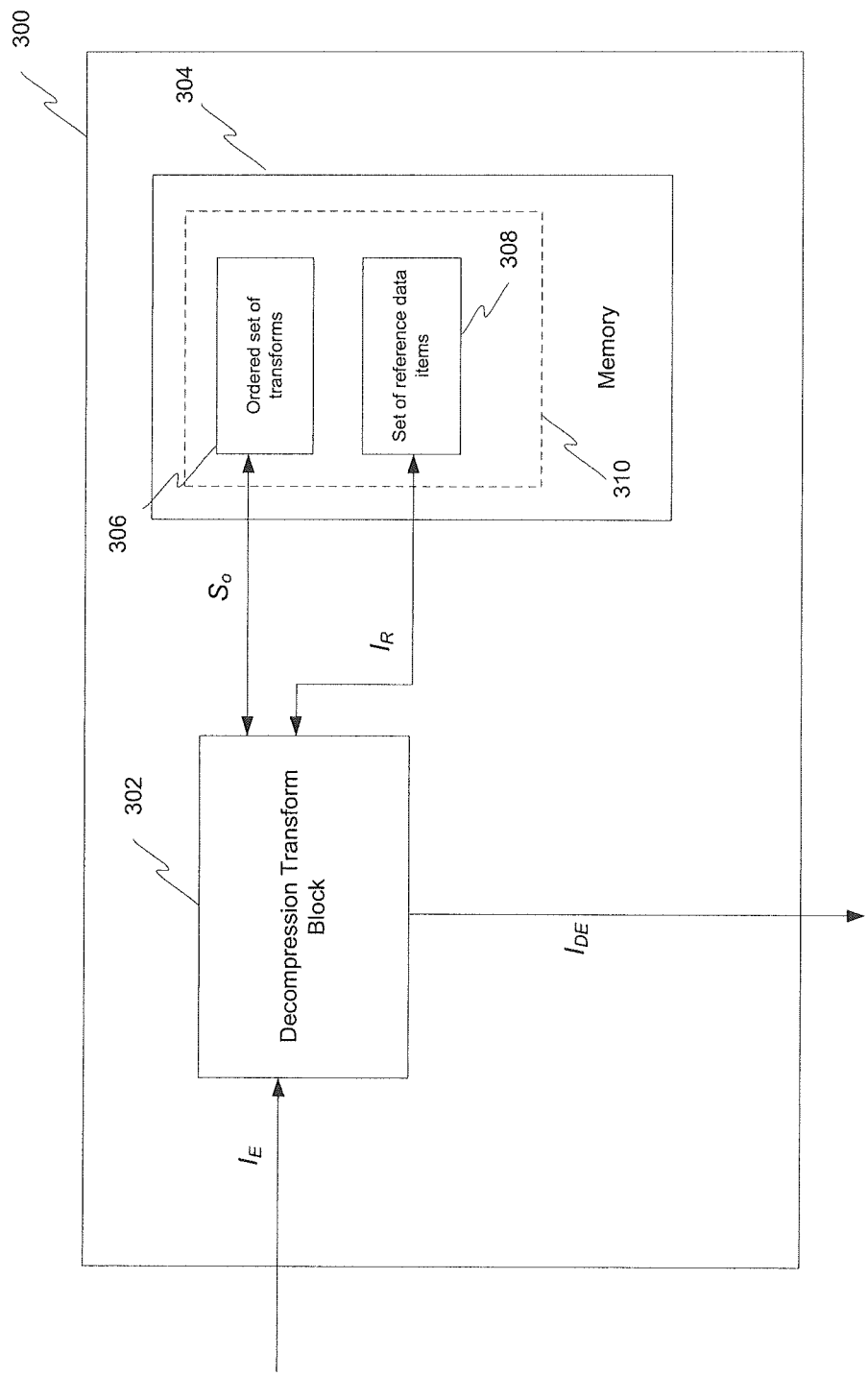
FIG. 3 shows a schematic illustration of an image data decompressor for decompressing compressed image data, such as data compressed by the image data compressor shown in FIG. 1.

FIG. 3 shows an image data decompressor 300. The decompressor 300 may form part of a graphics core of a GPU. The image decompressor comprises a decompression transform block 302, and a memory 304. The memory 304 stores a predetermined set of transforms 306 and a set of reference items 308. This information may be stored as a single data structure (e.g. the unfolding structure discussed above), denoted by the dashed markings at 310. The predetermined set of transforms may be the set of decompression transforms determined by the image data compressor 100 at step 203. The set of decompression transforms may be 'predetermined' in the sense that they are determined previously (e.g. during the compression stage) and are known by the decompressor 300 at the time the compressed image data is to be decompressed. The set of reference items and ordered set of transforms may be stored as an unfolding data structure 310.

The decompression transform block is configured to receive at its first input the set of encoded image items IE for the compressed image data. The set of encoded image items may be retrieved from a memory (e.g. memory 304) or from another memory block (not shown). An input/output (I/O) interface of the decompression transform block is coupled to an I/O interface of the memory. The decompression transform block 302 and the memory 304 may be coupled together via a bus to allow bi-directional data transfer therebetween. An output interface of the decompression transform block is configured to output the decoded image data items that are generated from the set of encoded image items received at its input. The set of decoded image data items are denoted IDE.

Although the memory 304 is shown as forming part of the decompressor 300, this is for the purpose of illustration only. The memory 304 may be an external memory accessed by the decompressor unit to decompress image data. It may be an external memory accessed by the GPU, for example. The external memory may be accessed via a cache in order to lower external bandwidth and/or decrease average latency.

The operation of the decompressor 300 to decompress compressed image data will now be described with reference to FIG. 7. The operation of the decompressor will be described with reference to a single encoded image data item only. This is for the purposes of illustration, and it will be appreciated that the following steps may be applied to each of the encoded image data items (in order to decode an entire image), or to a subset of encoded image data items in order to decode a portion, or sub-region, of the image. In some examples the decompressor may decode a single image data item and decode that item independently of the other image data items.

At step 701 the decompression transform block 302 receives a set of one or more encoded image items that encode data for an image. The data set may include encoded data for an entire image. In other examples, the data set may include encoded data for a sub-region of the image (i.e. the set may only include a subset of encoded image values for an image). The set may include only a single encoded image data item. As described above, the decompression transform block may load the data to be decoded from memory (e.g. memory 304 or an external memory).

At step 703, the decompression transform 302 block uses the encoded image data item to apply the sequence of transforms identified by that encoded item to a reference data item to thereby transform the reference data item to a decoded image data item.

Figure 8:
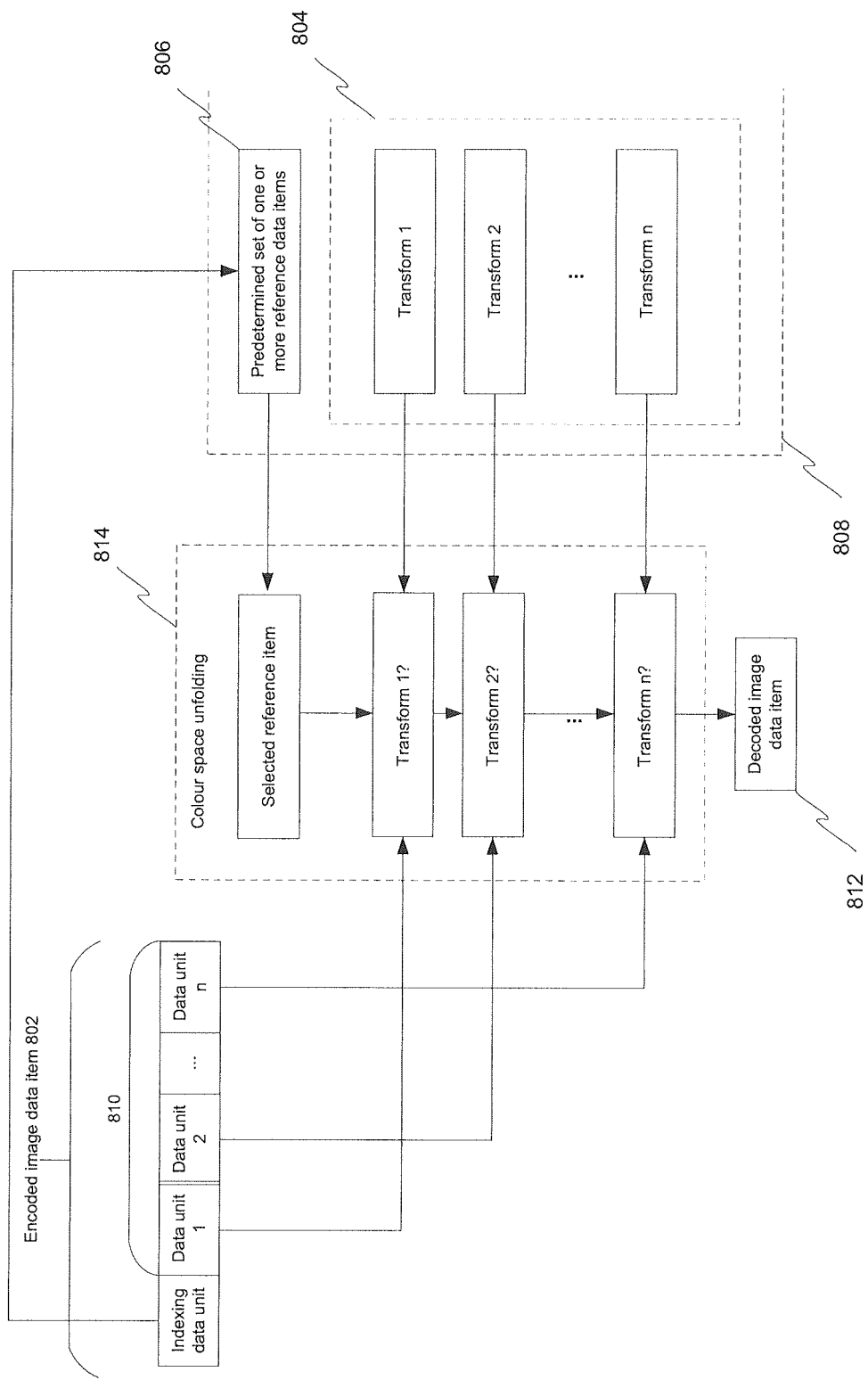
FIG. 8 is a schematic illustration of how an encoded image value is used to apply a sequence of transforms to a reference value (e.g. one of the reference values shown in FIG. 5) to transform the reference value to a decoded image value.

A schematic illustration of this process is shown in FIG. 8. Here, an encoded image data item 802 is being used to apply a sequence of transforms from an ordered set of transforms 804 to a reference data item. The ordered set of transforms comprises n transforms. The reference data item is selected from a set of one or more reference items 806, e.g. based on information associated with the encoded item, as described below. The ordered set of transforms 804 and the set of reference items may be stored together as a data structure 808.

If there is more than one reference data item in the set 806, the encoded data item may contain an indexing data unit to index one of the reference data items from the set. In this case, the decompression transform block 302 receives the encoded data item 802 and uses the information contained in the indexing data unit to select a reference data item from the predetermined set 806. That is, the indexing unit may be used to index a vector quantization codebook. Continuing our previous example described with reference to FIGS. 4-6, the set of reference data items A'-F' specify reference values 602, 604, 606 and 608. The indexing data unit may contain a binary string to index a particular reference item from the predetermined set. For example, if there are four reference items in the predetermined set, a binary string of 2 bits may be sufficient to index any one of the reference items.

The decompression transform block may use the indexing unit to select the reference data item directly from its stored location in memory. Alternatively, it may load the data structure 808 into local memory prior to decoding the set of encoded data items. The latter approach may increase the demands of the local memory of the decompressor but may improve memory bandwidth compared to the former approach as data may not need to be repeatedly loaded from an external memory. Alternatively, a local cache may be used to load portions of the data structure on demand.

If the compacted region of colour space is represented by a single reference value only, the encoded data item may not contain an indexing data unit. In this case the decompression transform receives the encoded data item but does not need to select a reference value as there is only a single reference value in the set 806.

The transform block 302 then processes the series of data units 1 to n (denoted at 810) to apply a sequence of transforms from the ordered set of transforms to the selected reference item. This process is illustrated generally at 814. In particular, each data unit of the series 810 contains information indicating the selective application of a corresponding transform of the ordered set of transforms. For example, data unit 1 contains information that indicates whether transform 1 is to be applied or not; data unit 2 contains information that indicates whether transform 2 is to be applied or not, and so on. Alternatively, each data unit may contain information corresponding to the selective application of one transform from a corresponding pair of transforms from the ordered set. That is, data unit 1 may indicate which transform from a first pair of transforms is to be applied; data unit 2 may indicate which transform from a second pair of transforms is to be applied, and so on. Each data unit may comprise a single bit that indicates either that a corresponding transform is to be applied or not, or that indicates which of a corresponding pair of transforms is to be applied. For example, the transform block 302 may be configured to apply a transform if the corresponding data unit contains a '1', and to not apply the transform if the corresponding data unit contains a '0'. If it is determined that a corresponding transform is not to be applied, the transform block may simply forward the data to the next transform, or it may apply an identity matrix so that the values in the tuple remain unchanged. It can be seen from these examples how each encoded data item contains information that represents the selective application of each transform from the ordered set of transforms to thereby identify the sequence of transforms for that encoded data item.

The transform block may additionally apply one or more transforms irrespective of the series of data units in the encoded data item. These transforms may be applied at fixed positions of the sequence for every data item being decoded. For example, transforms may be applied to reduce correlation between colour channels. Such transform(s) may be applied at fixed positions of the sequence for each data item. Because these transforms may be applied independently of the set of data items to be decoded, they may not require a corresponding data unit in the encoded data item. Thus in some examples the number of decompression transforms in the sequence may exceed the number of data units in the encoded data item. Because such transforms would be applied for all data items in the set to be decoded, the sequence of transforms to decode each encoded image data item would still in effect be identified from the series of data units in the encoded data item.

In the above schemes individual bit flags have been used to indicate either i) to apply a given transform or not to apply it or ii) the choice of which one of a pair of transforms to apply. In some situations, an alternative encoding method, one in which a non-power of two set of choices, e.g, N=3 or 5, may be selected, at certain steps. Such a selection may choose between N different transforms or, alternatively, N−1 transforms and the option of not to transform. This approach may be more effective than the binary approach for cases, for example, where there are, say, 3 (or a multiple thereof) distinct clusters. The encoding of these selections, however, is slightly more involved but could be achieved, say, by using modulus operations on the encoding. In general, if there is a choice between N different transforms at each stage of 'n' stages of the sequence, the number of bits required to encode the identification of the sequence of is ceiling($\log_2(N^n)$) bits.

Once the sequence of transforms identified by the encoded data item 802 has been applied to the reference data item, the reference item is transformed to a decoded image data item 812. This process may be referred to as colour unfolding because the set of encoded data items encode how to unfold (via their respective sequences) the region of colour space quantized by the set of reference data items to the region of colour space spanned by the decoded image data.

As described above, because the set of reference items 806 might only represent a quantized version of the compacted region of colour space formed during the compression stage, a given encoded image data item may not decode exactly to the image data item that was encoded to produce that encoded item. This class of compression is commonly referred to as 'lossy'. Specifically, during the compression of the image data, each image data item specifying an initial position in colour space (e.g. position 518A) may be encoded as an identified sequence of transforms that reverses the transforms applied to that image data item during the colour space folding.

Under such a scheme, each image data item is encoded on the implicit assumption that the identified sequence of transforms are applied to its respective corresponding transformed data item following the colour space folding (e.g. that the identified sequence of transforms for image data item A are applied to the transformed data item located at point 518A" in colour space). However, during decoding the sequence of transforms represented by an encoded data item are applied to a predetermined reference item (e.g. representing position 608). If the reference item does not represent the same point in colour space as the transformed image data item (e.g. if position 608 is not the same position in colour space as position 518A"), then the decoded data item generated from an encoded item may not represent exactly the same position in colour space as the original image data item encoded by that encoded item. However, depending on the extent of the colour folding during the compression stage, and/or the level of quantization of the folded region, a decoded image data item may nevertheless specify a position in colour space that corresponds to the position in colour space encoded by the encoded value. A decoded image data item could for example specify the same position in colour space as the original image data item that was encoded, or it may specify a similar position in colour space (e.g. the decoded data item specifies a position in colour space in the vicinity of that for the original image data item).

At step 705 it is determined whether there are any further encoded data items in the set that have not been decoded. If there are, then step 703 is repeated for the next encoded data item in the set. If there are no further encoded data items to decode (i.e. a decoded data item has been generated for each encoded data item in the set IE, or the subset of IE that is to be decoded), then at step 707 the set of decoded image data items are stored as decompressed image data. The decompressed image data may be stored in memory 304, in some external memory accessible by the GPU, or treated as transient, or intermediate, data that is delivered to another unit for further process. Step 705 may be performed prior to step 707 (as described here), or alternatively a decoded data item may be stored before a subsequent encoded data item is decoded (i.e. step 707 occurs prior to step 705). At step 709 the process ends.

If more than one image data item is to be decoded, then step 703 is repeated. If step 703 is to be performed multiple times to decode a given data set, then each cycle may be performed sequentially (as described in this example), in parallel (i.e. two or more encoded data items are decoded in parallel), or a combination of both.

It follows from the examples above that each decoded image data item may be in the form of a tuple. It may be in the same format as the data items in the image data $I_D$ that were compressed by the image data compressor 100. For example, if each original image data item (prior to compression) contained colour values in the form of an n-tuple, the decoded image data items may also contain colour values in the form of an n-tuple. In other words the set of decoded image data items represents image data that is the same as, or closely matches, the image data $I_D$ that was compressed.

The methods of compressing and decompressing image data described above enable image data comprising a set of image data items (e.g. vectors) to be stored in a compressed format. The approaches described herein may have particular benefits when applied to texture data (i.e. when the image data $I_D$ is texture data). In such an application, each image data item in the texture data may represent one or more colour values associated with a respective block of one or more texels of the texture. The set of such data items in the data $I_D$ may represent the colour data for a particular texture.

One feature of texture data that may make it suitable for the compression (and decompression) techniques described herein is the relatively restricted region of colour space populated by most textures. If the populated region of colour space is relatively restricted, or localised, then a series of compacting transforms may more readily be found that can compact the region of colour space occupied by that data (compared, for example, to a less defined or more dispersed occupied region of colour space). In addition, it has been realised that a number of different textures may have similar distributions within colour space and so a single unfolding structure may be shared by different textures (potentially leading to greater memory savings if a library of textures are to be compressed). The image data $I_D$ may comprise or be associated with an address that references the unfolding structure (e.g. in memory). This may enable different sets of compressed image data to reference the same unfolding structure in the event those sets of data represent textures having similar distributions in colour space.

Some existing schemes for storing compressed texture data are to represent the data as a plurality of words, say 64-bit, of data each associated with a respective region of texels which may be non-overlapping blocks (e.g. a 4×4 block, 8×4 block or 8×8 block of texels to give some examples), or be overlapping regions, (e.g. 9×9 regions repeated at 4×4 intervals). Each word stores a pair of colour values associated with the respective texel region and, for the case of non-overlapping blocks those colour values can then be modulated to determine per-texel colours that lie between the two colour values. For the overlapping case, the per-texel colours may use more complex combinations of the pairs of colours and neighbouring pairs. As an example, it may be possible to encode a pair of colours within a 64-bit word in 30 or 31 bits, leaving the remaining bits to define the per-texel colour modulation data. However, using the compression and decompression methods described herein, it has been found it is possible to encode, with relatively little loss in precision, each pair of RGBα colour values for an example data set which were originally represented in a 5554 bit format (i.e. 19 bits per colour value; 38 bits per colour value pair) using only 14 bits (if we ignore the overhead for transforms, etc.), so that per 64-bit word 14 bits are required to encode the colour values. This offers a potential bit-saving of 16 or 17 bits per 64-bit word compared to the existing approaches. The released bits may be used to, for example, improve the accuracy of the colour modulation data. Pairs of colour values may be stored in as little as 14 bits because it has been calculated that for certain textures, an ordered set of 11 transforms can give sufficient accuracy in the compression and decompression of the texture data, and thus each pair of colour values can be encoded in 11 bits (the remaining 3 bits may be used to index the reference value to which the transforms are to be applied, and/or to specify the nature of the pairs of colour values that are encoded). It has further been calculated that a data structure comprising an ordered set of 11 transforms and a set of four reference values may be stored in approximately 850 bits. This is possible with the use of a restricted set of transforms (e.g. rotations, scaling, scaling and/or translations), as described above. Thus the compression and decompression methods described herein may offer an improvement in memory requirements for storing texture data compared to existing texture compression schemes that require 30 bits per 64-bit word for storing colour data when a texture comprises more than approximately 850/16≈53 blocks of 4×4 texels.

The approaches described herein may also be applied to colour data in which each image data item represents one or more colour values associated with a respective block of one or more pixels of an image. Due to their relatively restricted, or limited, distribution of values in colour space, grey-scale images are an example class of images that may benefit from the compression methods described herein.

An illustration of the compression (and subsequent decompression) of image values is described herein with reference to FIGS. 4 to 6, in which the series compression transforms and derived set of decompression transforms each consisted of two transforms. It will be appreciated that the number of transforms was chosen as two merely to aid illustration, and that in practice any suitable number of transforms may be applied to compress and decompress the image data. A greater number of transforms may enable the occupied region of colour space to be more tightly folded, which may lead to more accurate results when the image data is decompressed (by virtue of a given sized set of reference values being able to more accurately quantize the folded region of colour space).

The transforms used to compress and decompress the image data may be from a predetermined set. The set may be predetermined in the sense that it is the complete library of transforms capable of being accessed, or implemented, by the decompressor. Although the transforms illustrated herein were limited to reflections, it will be appreciated that other transforms may form part of the compacting series of transforms used in the data compression and/or the ordered set of transforms used for data decompression. These transformations may include, but are not limited to, translations, rotations, scaling operations and skew transforms. A transform may combine more than one operation such as scaling and then translating the data. Scaling the data may be useful for altering the profile/shape of the envelope of the occupied region in colour space so as to better enable one part of the occupied region to be folded onto another part of the occupied region. In other words scaling the data may be useful for improving the symmetry of the occupied region of colour space to enable it to be more tightly folded. The skew transform may be used to take advantage of correlation between different channels of the data. This may be done to reverse the effects of the decorrelation transforms applied to the data during compression. A rotary transform may cause a point in value space to be rotated about a centre of rotation. It will be appreciated that these transforms are merely an illustration of the types of transform that may be used to fold and unfold the value space and that other types of transform may also be used.

There may be a trade-off between the number of types of transforms applied during compression and the computational cost and complexity of performing the compression. The number of types of transformation may also have an impact on the amount of data required for each transformation. For example, a more diverse set of transformation types may require more storage than a more restricted set. Applying a greater number of types of transforms during compression may result in a more compacted region of colour space (particularly if the compressor has a free choice of transform at each step of the compression), but at the risk of additional computational complexity. To reduce the complexity of the compression process, the compressor may be configured to use a predetermined sequence of transform types (i.e. be limited to a predetermined set of transform types). In this case, the compressor may only need to determine the parameters of each transform in the sequence during compression.

In the examples illustrated herein, the occupied regions of colour space are single continuous regions (e.g. regions 406 and 516). It will be appreciated that the techniques described herein are equally applicable to image data that, prior to compression, occupies a region in value space that is discontinuous and comprises two or more distinct sub-regions (for example as shown in FIG. 9). For example, a texture or image may be made from different shades of two predominantly distinct colours. In this case, transforms may be applied during compression that fold one sub-region onto another sub-region.

Figure 10:
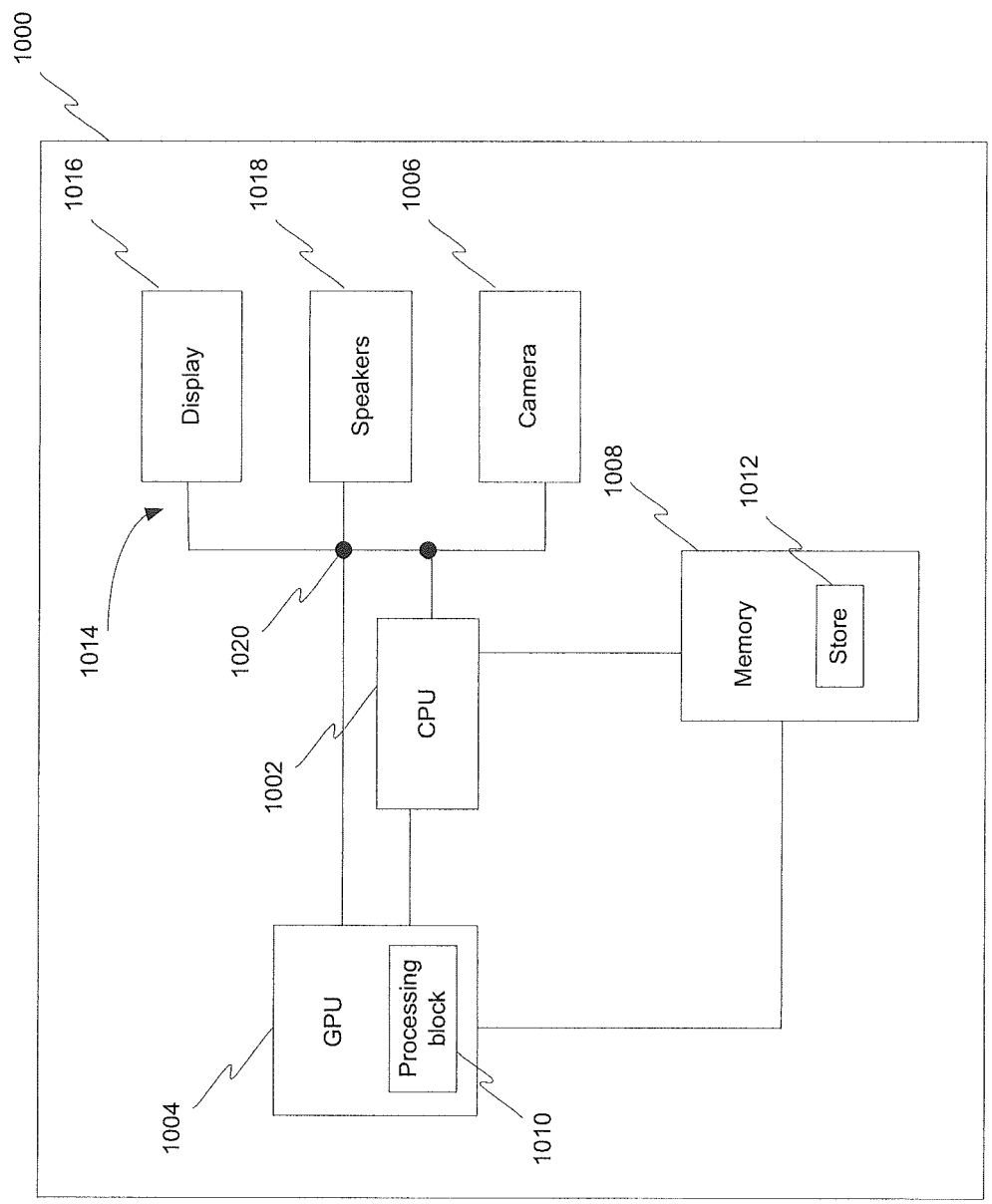
FIG. 10 shows a computer system in which an image data compressor and/or decompressor is implemented.

FIG. 10 shows a computer system 1000 in which the graphics processing systems described herein (the image compressor and image decompressor) may be implemented. The computer system comprises a CPU 1002, a GPU 1004, a memory 1008 and other devices 1014, such as a display 1016, speakers 1018 and a camera 1006. A processing block 1010 is implemented on the GPU 1004. In other examples, the processing block 1010 may be implemented on the CPU 1002. The components of the computer system can communicate with each other via a communications bus 1020. A store 1012 is implemented as part of the memory 1008.

The image data compressor and image data decompressor of FIGS. 1 and 3 are shown as comprising a number of functional blocks. This is schematic only and is not intended to define a strict division between different logic elements of such entities. Each functional block may be provided in any suitable manner. It is to be understood that intermediate values described herein as being formed by compressor/decompressor need not be physically generated by the compressor/decompressor at any point and may merely represent logical values which conveniently describe the processing performed by the compressor/decompressor between its input and output.

Although the examples described above have referred to the compression and decompression of image data, it will be appreciated by anyone skilled in the art of vector quantization, that these techniques may also be applicable to any data that can be VQ compressed. This can include, for example, audio data, 3D position data from laser-scanned or synthetic models, MRI data, or measurements of properties of other natural phenomena.

The image data compressors and decompressors described herein may be embodied in hardware on an integrated circuit. The image data compressors and decompressors described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a compressor and/or decompressor configured to perform any of the methods described herein, or to manufacture a compressor and/or decompressor comprising any apparatus described herein. An integrated circuit definition dataset may be, for example, an integrated circuit description.

Therefore, there may be provided a method of manufacturing, at an integrated circuit manufacturing system, an image data compressor and/or decompressor as described herein. Furthermore, there may be provided an integrated circuit definition dataset that, when processed in an integrated circuit manufacturing system, causes the method of manufacturing an image data compressor and/or decompressor to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a compressor and/or decompressor will now be described with respect to FIG. 11.

Figure 11:
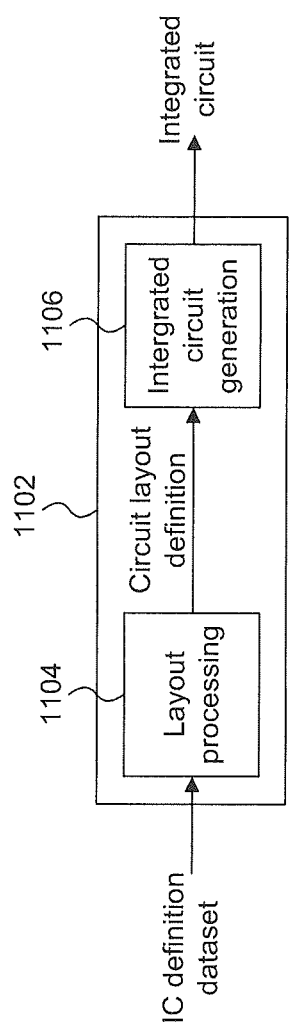
FIG. 11 shows an integrated circuit manufacturing system.

FIG. 11 shows an example of an integrated circuit (IC) manufacturing system 1102 which comprises a layout processing system 1104 and an integrated circuit generation system 1106. The IC manufacturing system 1102 is configured to receive an IC definition dataset (e.g. defining a compressor and/or decompressor as described in any of the examples herein), process the IC definition dataset, and generate an IC according to the IC definition dataset (e.g. which embodies a compressor and/or decompressor as described in any of the examples herein). The processing of the IC definition dataset configures the IC manufacturing system 1102 to manufacture an integrated circuit embodying a compressor and/or decompressor as described in any of the examples herein.

The layout processing system 1104 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1104 has determined the circuit layout it may output a circuit layout definition to the IC generation system 1106. A circuit layout definition may be, for example, a circuit layout description.

The IC generation system 1106 generates an IC according to the circuit layout definition, as is known in the art. For example, the IC generation system 1106 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1106 may be in the form of computer-readable code which the IC generation system 1106 can use to form a suitable mask for use in generating an IC.

The different processes performed by the IC manufacturing system 1102 may be implemented all in one location, e.g. by one party. Alternatively, the IC manufacturing system 1102 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a compressor and/or decompressor without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 11 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 11, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A data decompressor configured to decompress compressed data comprising an item of encoded data, and a set of one or more reference data items, the encoded data item identifying one or more transforms from a predetermined set of transforms, the data decompressor being configured to:
use the encoded data item to apply the one or more transforms identified by that encoded data item to a reference data item selected from the set of one or more reference data items to thereby transform that reference data item to a decoded data item.

2. The data decompressor as claimed in claim 1, wherein the data is image data.

3. The data decompressor as claimed in claim 2, wherein the decoded data item represents a position in a colour space.

4. The data decompressor as claimed in claim 1, wherein the data decompressor is configured to load the set of one or more reference data items and the predetermined set of transforms from a memory.

5. The data decompressor as claimed in claim 1, wherein the data decompressor is configured to interpret information contained in the encoded data item to select said reference data item from the set of one or more reference data items.

6. The data decompressor as claimed in claim 1, wherein the data decompressor is configured to interpret information contained in the encoded data item representing the selective application of each transform from the predetermined set of transforms to thereby identify the one or more transforms to be applied to the selected reference data item.

7. The data decompressor as claimed in claim 1, wherein the compressed data comprises a plurality of encoded data items, and wherein the data decompressor is configured to, for each encoded data item, use the encoded data item to apply the one or more transforms identified by that encoded data item to one of the reference data items selected from the set of one or more reference data items to thereby transform the reference data item to a decoded data item.

8. A non-transitory computer readable storage medium having stored thereon a computer readable dataset description of an integrated circuit that, when processed in an integrated circuit manufacturing system, causes the integrated circuit manufacturing system to manufacture a data decompressor configured to decompress compressed data comprising an item of encoded data, and a set of one or more reference data items, the encoded data item identifying one or more transforms from a predetermined set of transforms, the data decompressor being configured to:

use the encoded data item to apply the one or more transforms identified by that encoded data item to a reference data item selected from the set of one or more reference data items to thereby transform the reference data item to a decoded data item.

9. A non-transitory computer readable storage medium having stored thereon a computer readable dataset description of an integrated circuit that, when processed in an integrated circuit manufacturing system, causes the integrated circuit manufacturing system to manufacture a data compressor configured to compress data to thereby determine compressed data, wherein the data comprises one or more data items, the compressor being configured to:

encode each of the one or more data items as a representation of one or more decompression transforms from a fixed set of decompression transforms that generates an approximation of that data item when applied to a selected one of a set of one or more reference data items; and wherein the compressed data comprises the one or more encoded data items, the set of one or more reference data items and the fixed set of decompression transforms.

* * * * *